(12) United States Patent
Fortusini et al.

(10) Patent No.: US 10,564,354 B2
(45) Date of Patent: Feb. 18, 2020

(54) FLEXIBLE GLASS OPTICAL-ELECTRICAL INTERCONNECTION DEVICE AND PHOTONIC ASSEMBLIES USING SAME

(71) Applicant: CORNING OPTICAL COMMUNICATIONS LLC, Hickory, NC (US)

(72) Inventors: Davide Domenico Fortusini, Ithaca, NY (US); Scott Christopher Pollard, Big Flats, NY (US); Alexander Mikhailovich Streltsov, Corning, NY (US); James Scott Sutherland, Corning, NY (US)

(73) Assignee: Corning Optical Communications LLC, Charlotte, NC (US)

( * ) Notice: Subject to any disclaimer, the term of this patent is extended or adjusted under 35 U.S.C. 154(b) by 0 days.

(21) Appl. No.: 15/846,312

(22) Filed: Dec. 19, 2017

(65) Prior Publication Data

US 2018/0172905 A1    Jun. 21, 2018

Related U.S. Application Data

(60) Provisional application No. 62/437,388, filed on Dec. 21, 2016.

(51) Int. Cl.
  *G02B 6/126* (2006.01)
  *G02B 6/42* (2006.01)
  (Continued)

(52) U.S. Cl.
  CPC .......... *G02B 6/125* (2013.01); *G02B 6/4214* (2013.01); *G02B 6/1228* (2013.01); *G02B 6/13* (2013.01);
  (Continued)

(58) Field of Classification Search
  None
  See application file for complete search history.

(56) References Cited

U.S. PATENT DOCUMENTS 6,154,593 A    11/2000 Miura et al.
6,438,295 B1    8/2002 McGarry et al.
(Continued)

FOREIGN PATENT DOCUMENTS

CN    102116898 A    7/2011
JP    2004046031 A    2/2004
(Continued)

OTHER PUBLICATIONS

Akiyama et al; "Air Trench Bends and Splitter for Dense Optical Integration in Low Index Contrast"; Journal of Lightwave Technology, vol. 23, No. 7, Jul. 2005; pp. 2271-2277.
(Continued)

*Primary Examiner* — Michelle R Connelly
(74) *Attorney, Agent, or Firm* — Adam R. Weeks

(57) ABSTRACT

The optical-electrical interconnection device comprises a glass support member with front-end and back-end portions that define a plane and an aperture. A cantilever member extends from the back-end portion into the aperture. The cantilever member supports an interconnection optical waveguide. The cantilever member comprises a bend region that causes a front-end section of the cantilever member to extend out of the plane. The front-end section is flexible, which allows for the interconnection optical waveguide to be aligned and optically coupled to a device waveguide of an optical-electrical device. A photonic assembly is formed using the optical-electrical interconnection device and at least one optical-electrical device. Methods of forming optical and electrical interconnections using the optical-electrical interconnection device are also disclosed.

46 Claims, 28 Drawing Sheets

(51) Int. Cl.
  *G02B 6/125* (2006.01)
  *G02B 6/122* (2006.01)
  *G02B 6/13* (2006.01)
(52) U.S. Cl.
  CPC ............ *G02B 6/423* (2013.01); *G02B 6/4206* (2013.01); *G02B 6/4225* (2013.01); *G02B 6/4232* (2013.01)

(56) References Cited

U.S. PATENT DOCUMENTS

| | | | |
|---|---|---|---|
| 6,573,026 | B1 | 6/2003 | Aitken et al. |
| 6,690,845 | B1* | 2/2004 | Yoshimura ......... G02B 6/12002 257/E23.01 |
| 6,697,554 | B2 | 2/2004 | McGarry et al. |
| 6,768,850 | B2 | 7/2004 | Dugan et al. |
| 7,184,617 | B2* | 2/2007 | Korenaga ............ G02B 6/1221 385/14 |
| 7,257,295 | B2 | 8/2007 | Yokouchi |
| 7,329,050 | B1 | 2/2008 | Dugan et al. |
| 7,409,118 | B2 | 8/2008 | Said et al. |
| 8,270,784 | B2 | 9/2012 | Thomson et al. |
| 8,270,788 | B2 | 9/2012 | Herman et al. |
| 8,270,792 | B1 | 9/2012 | Ng |
| 8,397,537 | B2 | 3/2013 | Grzybowski et al. |
| 8,442,368 | B1* | 5/2013 | Reano ................... G02B 6/136 385/29 |
| 8,597,871 | B2 | 12/2013 | McLeod |
| 9,124,959 | B2 | 9/2015 | Xu et al. |
| 9,359,252 | B1 | 6/2016 | Masters et al. |
| 9,594,220 | B1 | 3/2017 | Sutherland |
| 2003/0099452 | A1 | 5/2003 | Borrelli et al. |
| 2004/0184704 | A1* | 9/2004 | Bakir ................. G02B 6/12002 385/14 |
| 2004/0258359 | A1 | 12/2004 | Corkum et al. |
| 2006/0056765 | A1* | 3/2006 | Hwang .................. G02B 6/423 385/39 |
| 2009/0310906 | A1 | 12/2009 | Miyatake |
| 2013/0067715 | A1* | 3/2013 | Oggioni ................... G02B 6/43 29/428 |
| 2014/0126030 | A1 | 5/2014 | Crespi et al. |
| 2016/0011438 | A1* | 1/2016 | Reano .................. H05K 999/99 385/2 |

FOREIGN PATENT DOCUMENTS

| | | |
|---|---|---|
| JP | 2005010373 A | 1/2005 |
| JP | 2005156945 A | 6/2005 |
| JP | 2006201014 A | 8/2006 |
| JP | 03925209 B2 | 6/2007 |
| JP | 04514999 B2 | 7/2010 |
| WO | 2018022318 A1 | 2/2018 |
| WO | 2018022319 A1 | 2/2018 |

OTHER PUBLICATIONS

Boisset et al; "Design and Construction of an Active Alignment Demonstrator for a Free-Space Optical Interconnect"; IEEE Photonics Technology Letters, vol. 7, No. 6, Jun. 1995; pp. 676-678.
Brusberg et al; "Single-Mode Glass Waveguide Platform for DWDM Chip-To-Chip Interconnects"; IEEE; (2012) pp. 1532-1539.
Dai et al; "Deeply Etched SiO2 Ridge Waveguide for Sharp Bends"; Journal of Lightwave Technology, vol. 24, No. 12, Dec. 2006; pp. 5019-5024.
Eaton et al; "Heat Accumulation Effects in Femtosecond Laser-Written Waveguides With Variable Repetition Rate"; Optics Express, vol. 13, No. 12; (2005) pp. 4708-4716.
He et al; "Femtosecond Laser Fabrication of Monolithically Integrated Microfluidic Sensors in Glass"; Sensors; 14; (2014) pp. 19402-19440.
Hiramatsu et al; "Laser-Written Optical-Path Redirected Waveguide Device for Optical Back-Plane Interconnects"; IEEE Photonics Technology Letters, vol. 16, No. 9; Sep. 2004; pp. 2075-2077.
Huang et al; "Ultrafast Laser Fabrication of 3D Photonic Components in Flexible Glasses"; OFC/OSA 2014; 3 Pages.
Liao et al; "Femtosecond Laser Nanostructuring in Porous Glass With Sub-50 nm Feature Size"; Optics Letters; vol. 38, No. 2; (2013); pp. 187-189.
Marcuse; "Length Optimization of an S-Shaped Transition Between Offset Optical Waveguides"; Applied Optics, vol. 17, No. 5; (1978); pp. 763-768.
Nasu et al; "Developments in Laser Processing for Silica-Based Planar Lightwave Circuits"; Proc. of SPIE, vol. 6107; (2006) pp. 61070B-1-61070B-9.
Nasu et al; "Low-Loss Waveguides Written With a Femtosecond Laser for Flexible Interconnection in a Planar Light-Wave Circuit"; Optics Letters, vol. 30, No. 7 (2005); pp. 723-725.
Nasu et al; "Waveguide Interconnection in Silica-Based Planar Lightwave Circuit Using Femtosecond Laser"; Journal of Lightwave Technology, vol. 27, No. 18, (2009), pp. 4033-4039.
Ryu et al; "Optical Interconnection for a Polymeric PLC Device Using Simple Positional Alignment"; Optics Express, vol. 19, No. 9; (2011) pp. 8571-8579.
Schroder et al; "New Options for Chip-To-Chip Photonic Packaging by Using Thin Glass-Based Waveguide Substrates on Board and Module Level"; Proc. of SPIE; vol. 7607 (2010) pp. 76070F-1-76070F-10.
Streltsov et al; "Fabrication and Analysis of a Directional Coupler Written in Glass by Nanojoule Femtosecond Laser Pulse"; Optics Letters, vol. 26, No. 1; (2001) pp. 42-43.
Streltsov et al; "Study of Femtosecond-Laser-Written Waveguides in Glasses"; J. Opt. Soc. Am B; vol. 19, No. 10 (2002) pp. 2496-2504.
Sugihara et al; "Light-Induced Self-Written Polymeric Optical Waveguides for Single-Mode Propagation and for Optical Interconnections"; IEEE Photonics Technology Letters, vol. 16, No. 3, (2004) pp. 804-806.
Thomson et al; "Ultrafast-Laser Inscription of a Three Dimensional Fan-Out Device for Multicore Fiber Coupling Applications"; Optics Express, vol. 15, No. 18; (2007) pp. 11691-11697.
Vazquez et al; "Integration of Femtosecond Laser Written Optical Waveguides in a Lab-On-Chip"; Lab Chip; 9; (2009) pp. 91-96.
Yanagisawa et al; "Film-Level Hybrid Integration of AlGaAs Laser Diode With Glass Waveguide on Si Substrate"; IEEE Photonics Technology Letters, vol. 4, No. 1; (1992); pp. 21-23.
Florian Lohse et al; "Optical Interconnection Assemblies, Glass Interconnection Substrates, and Methods of Making an Optical Connection"; Filed as U.S. Appl. No. 15/898,967 on Feb. 19, 2018; 106 Pages.
Florian Lohse et al; "Optical Interconnection Assemblies, Glass Interconnection Substrates, and Methods of Making an Optical Connection" Filed as U.S. Appl. No. 15/898,982 on Feb. 19, 2018; 104 Pages.
Butler et al; "Optical-Electrical Printed Circuit Boards With Integrated Optical Waveguide Arrays and Photonic Assemblies Using Same"; Filed as U.S. Appl. No. 15/789,132 on Oct. 20, 2017; 68 Pages.

\* cited by examiner

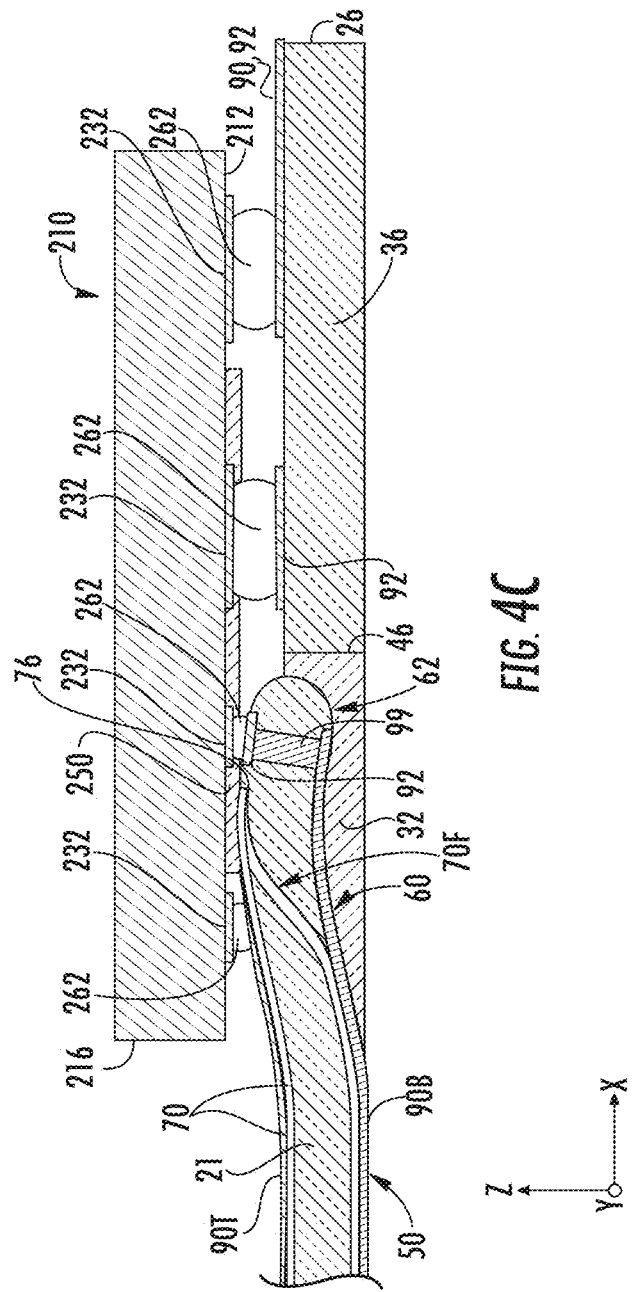

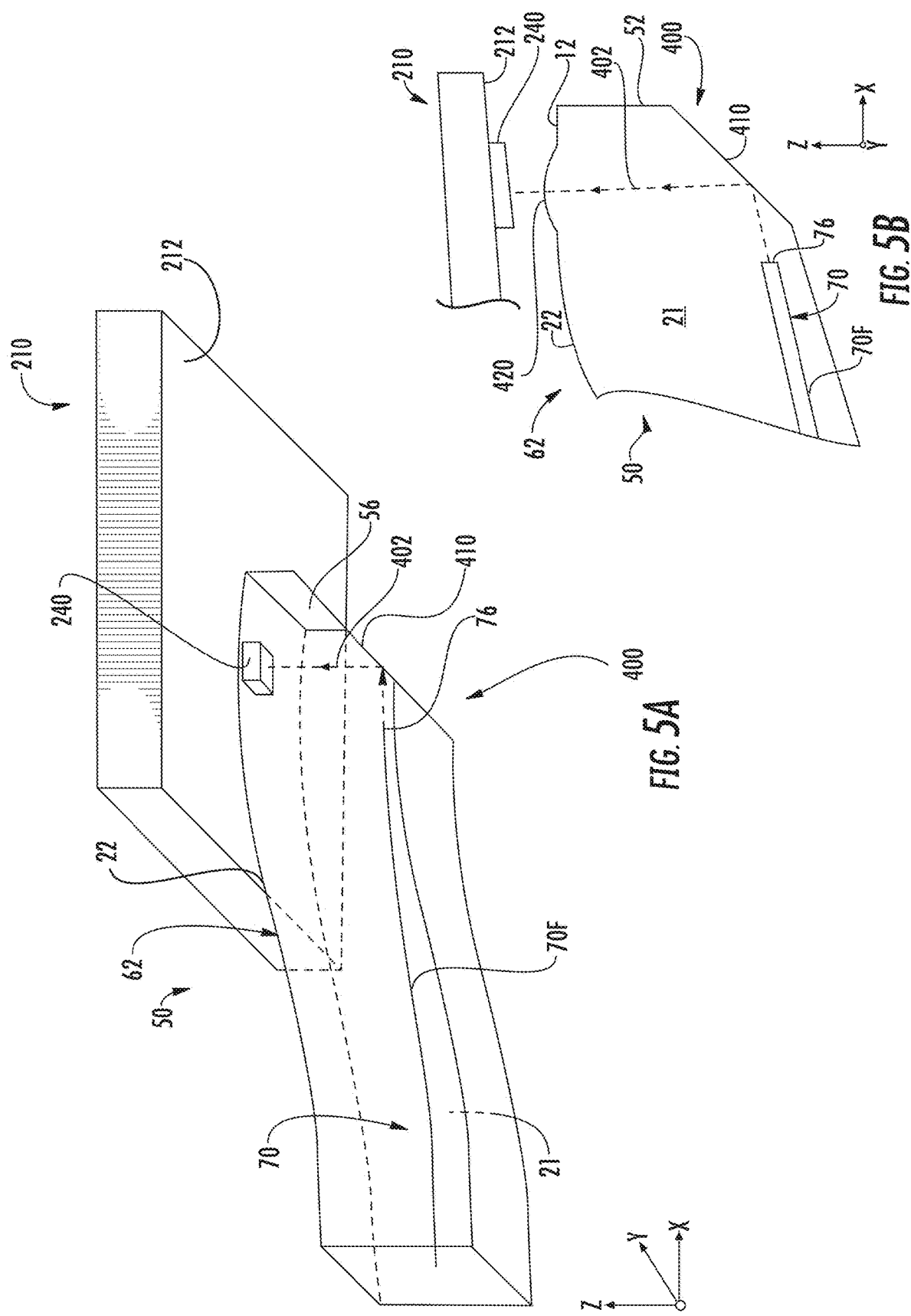

FLEXIBLE GLASS OPTICAL-ELECTRICAL INTERCONNECTION DEVICE AND PHOTONIC ASSEMBLIES USING SAME

PRIORITY APPLICATION

This application claims the benefit of U.S. Provisional Application No. 62/437,388, filed on Dec. 21, 2016, the content of which is relied upon and incorporated herein by reference in its entirety

FIELD

The present disclosure relates to optical and electrical interconnections made between components of a photonic assembly, and in particular relates to a flexible glass optical-electrical interconnection device for photonic assemblies.

BACKGROUND

Semiconductor integrated circuits (ICs) are typically mounted in or on a printed circuit board (PCB) as part of a packaging process for making an electrical assembly. For electrical ICs, individual metal electrical conductors are typically used to make electrical connections between first metal pads on the IC and second metal pads on the PCB as part of a process referred to in the art as "electrical conductor bonding."

The need for high-bandwidth communication with electrical ICs has prompted the addition of optical waveguide connections between optical+electrical ICs ("OE-ICs") and OE-PCBs that have both optical and electrical functionality and optical and electrical connection locations. Like the electrical conductor bonding of electrical ICs, optical electrical conductor bonding along with the electrical conductor bonding is performed between OE-ICs and OE-PCBs to form a photonic assembly.

Arrays of solder bumps are now being used to form electrical connections between electronic PCBs and electronic ICs in a "flip chip" configuration. Approaches for making the optical interconnections in a flip chip configuration include using individual optical fibers or micro-optics to define free-space optical paths. Unfortunately, these approaches suffer from serious alignment issues that make them relatively low yield and difficult to implement. Differences in the coefficient of thermal expansion (CTE) of the materials used for the different components of the photonic assembly can also lead to stresses and strains that can adversely affect the performance of the photonic assembly.

SUMMARY

An aspect of the disclosure is an optical-electrical (OE) interconnection device that includes a glass support member comprising a body, a top surface, a bottom surface, a front-end portion and a back-end portion. The body includes an aperture that separates the front-end and back-end portions. The front-end and back-end portions reside in a first plane. The glass support member also includes at least one cantilever element that extends into the aperture from the back-end portion toward the front-end portion. The at least one cantilever element has a bend region and a front-end section with a front end. The bend region causes the front-end section to extend in a first direction perpendicular to the first plane and is flexible in at least in the first direction. The OE interconnection device also includes at least one interconnection optical waveguide supported within the body of the glass support member and running from the back-end portion to the front-end section of the at least one cantilever member. The OE interconnection device also includes at least one electrical conductor supported by the glass support member.

Another aspect of the disclosure is a photonic assembly that includes the OE interconnection device described above and that further includes a first OE device that supports the OE interconnection device. The first OE device includes at least one of an electrical connection and an optical connection to the OE interconnection device.

Another aspect of the disclosure is a photonic assembly that includes the OE interconnection device described above, wherein the at least one electrical conductor defines first conductive elements. The photonic assembly also includes an (OE-PCB) that includes a top surface and a through hole. The OE-PCB includes second conductive elements. The OC-PCB also support the OE interconnection device so that the front-end section of the at least one cantilever element extends into the through hole so that the front-end section of the at least one cantilever element resides adjacent and above the top surface of the OE-PCB. The photonic assembly also includes an OE-IC having third conductive elements and that is supported adjacent and above the top surface of the OE-PCB in a flip-chip configuration using solder bumps. The OE-IC has at least one device waveguide. A front-end waveguide section of at least one interconnection optical waveguide is operably disposed relative to the at least one device waveguide to establish optical coupling therebetween. Also, the first, second and third conductive elements and the solder bumps are electrically connected to define a first electrical path between the OE-PCB and the OE-IC.

Another aspect of the disclosure is a method of optically interconnecting first and second OE devices. The method includes supporting an OE interconnection device with the first OE device. The OE interconnection device includes a glass support member having a back-end portion that defines a plane and having at least one cantilever element that extends from the back-end portion and that supports at least one interconnection optical waveguide and that has a front-end section that extends above the plane and that is flexible in at least a first direction perpendicular to the plane. The method further includes aligning the OE interconnection device with the second OE device by flexing the front-end section of the at least one cantilever member so that a front-end waveguide section of the at least one interconnection optical waveguide aligns with and is optically coupled to at least one device waveguide of the second OE device in an aligned position. The method also includes securing the front-end section of the at least one cantilever member to the second OE device in the aligned position.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIGS. 4A through 4C are close-up side views of an example OE interconnector along with an OE-IC illustrating additional configurations for the optical waveguides and electrical conductors supported by the OE interconnector;

FIG. 5A is a close-up elevated view of the front-end section of the cantilever element of an OE interconnector shown operably disposed adjacent an OE IC 210 and showing an example of a turning structure in the form of a total-internal-reflection surface formed on the front end of the cantilever element;

FIG. 5B is a close-up side view of an example configuration of the front-end section of the cantilever element of FIG. 5A that includes a lens element on the top surface;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

The term "micron" as used herein means micrometer, i.e., $1 \times 10^{-6}$ meter, which is abbreviated as "µm" in the art.

An optical-electrical (OE) device is any device that includes electrical and optical components that provide electrical and optical functionality. Example OE devices include an optical-electrical integrated circuit (OE-IC) and an optical-electrical printed circuit board (OE-PCB).

The term "optical-electrical interconnection device" or "OE interconnector" means a device that is used to optically and electrically couple or interconnect at least first and second OE devices and can also be called an OE interface device.

The term "photonic assembly" as used herein means a device that includes at least one OE device and an OE interconnector. An example photonic assembly includes two OE devices that are optically and electrically interconnected by the OE interconnector.

The term "waveguide" as used herein means an optical waveguide.

The term "buried" as used in connection with a waveguide or a waveguide section means that the high-index portion (i.e., the core) of the waveguide or waveguide section resides entirely below the top surface of the substrate in which the waveguide or waveguide section is supported.

OE Interconnector

Figure 1A:
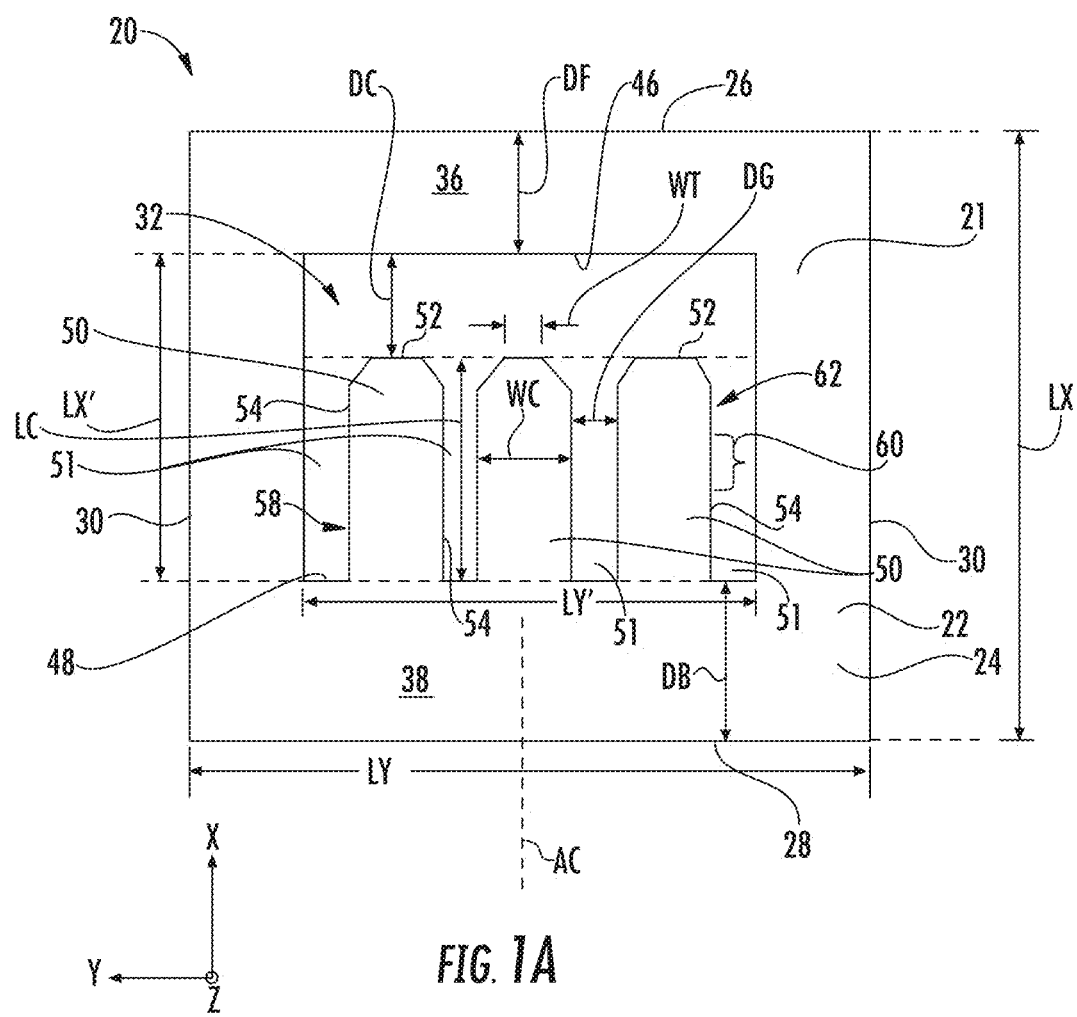
FIG. 1A is a top-down view of an example glass support member used to form an OE interconnector as disclosed herein.
Figure 1B:
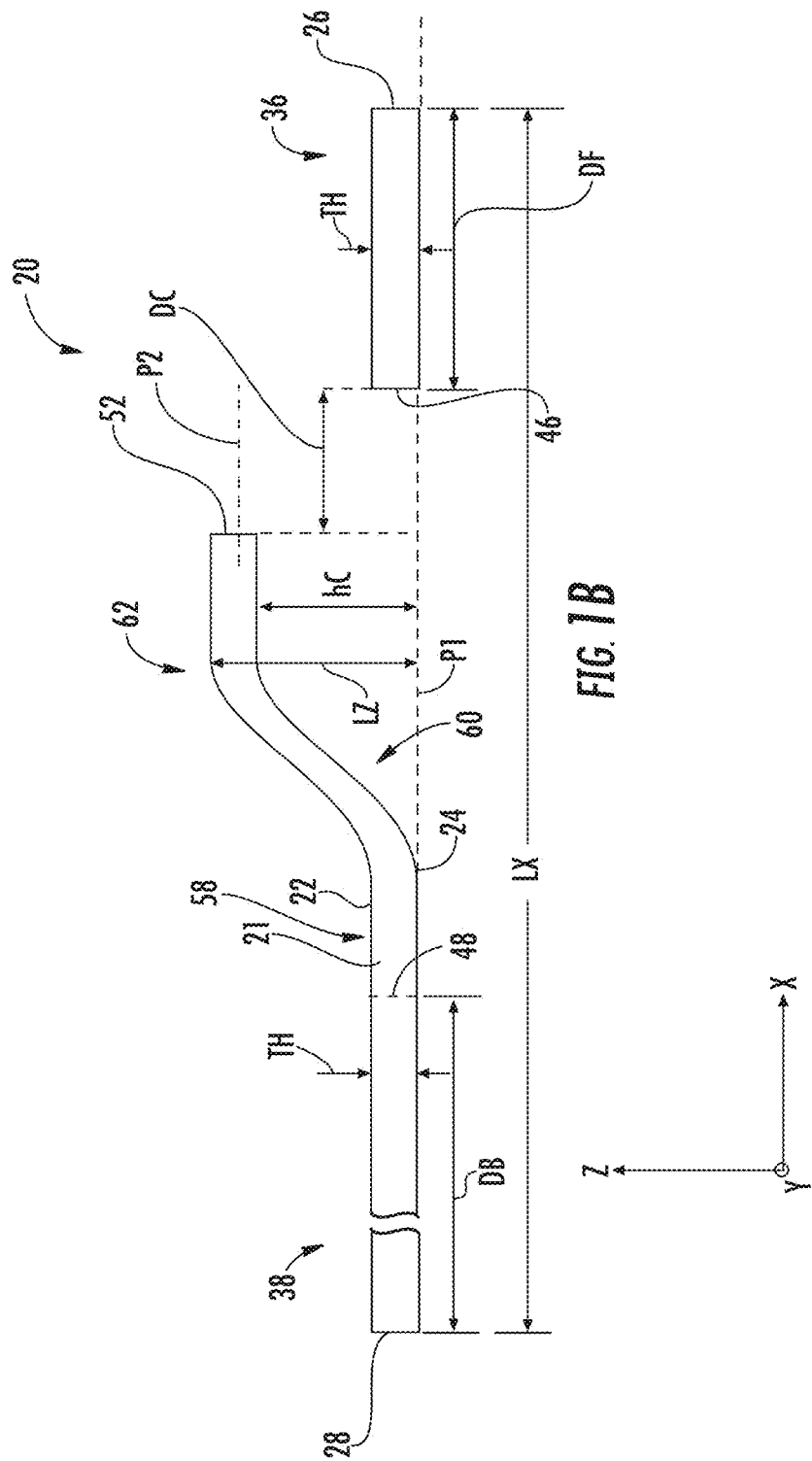
FIG. 1B is a cross-sectional view of the glass support member as taken along the central axis AC in the x-z plane.
Figure 1C:
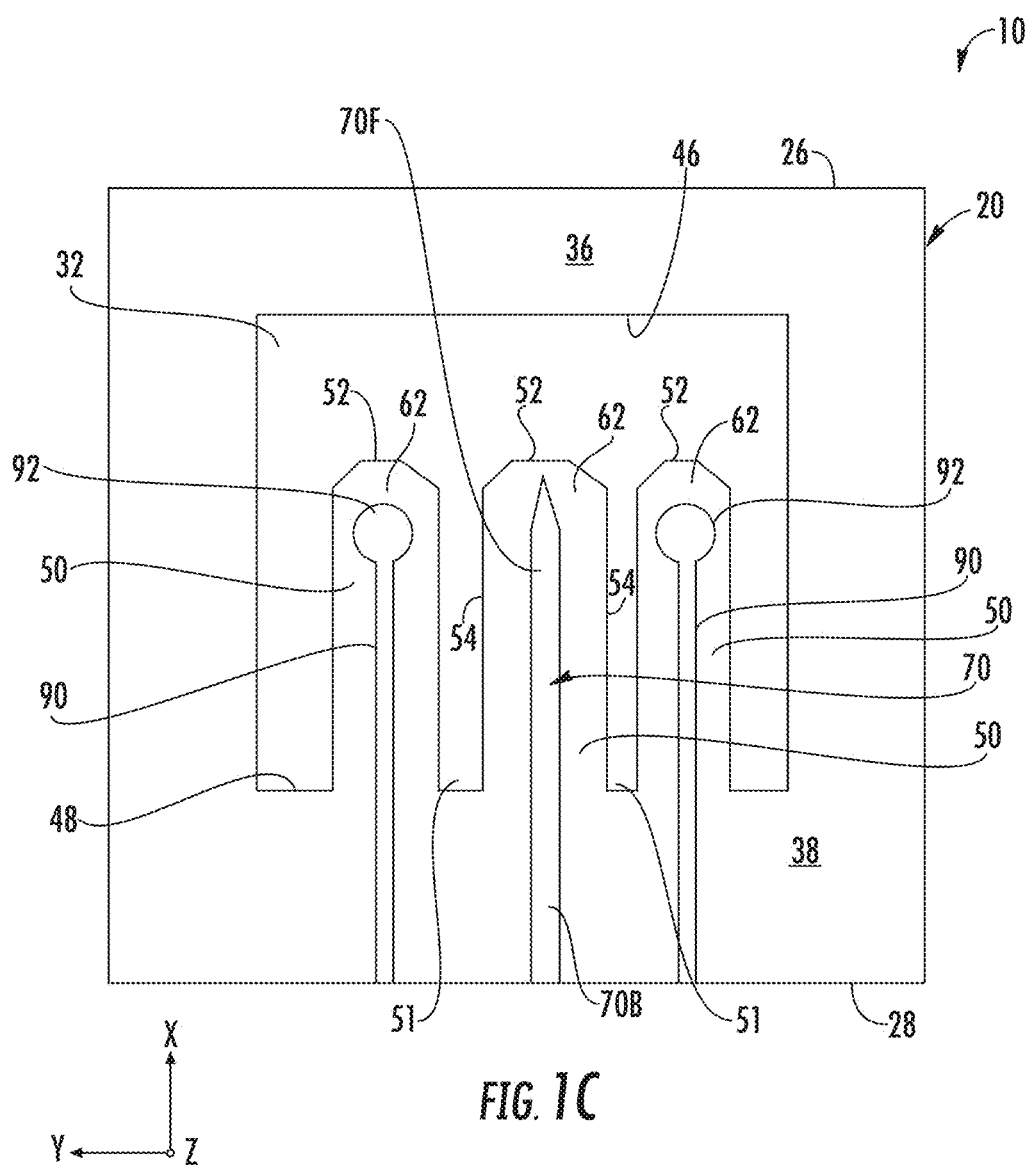
FIG. 1C is a top-down view of an example OE interconnector as formed from the glass support member of FIGS. 1A and 1B.

FIG. 1A is top-down view of an example glass support member 20 used to form an example OE interconnection device ("OE interconnector") 10 as disclosed herein. FIG. 1B is a cross-sectional view taken in the x-z plane and along a central axis AC of the glass support member 20 of FIG. 1A. FIG. 1C is a cross-sectional view similar to FIG. 1B and illustrating an example of the OE interconnector 10 as formed using the glass support member 20 of FIGS. 1A and 1B.

With reference to FIGS. 1A and 1B, the glass support member 20 has a body 21 with a body (or "bulk") refractive index $n_b$, a top surface 22, a bottom surface 24, a front end 26, a back end 28 and opposite sides 30. The glass support member 20 also has a thickness TH, and dimensions LX, LY and LZ in the x-direction, y-direction, and z-direction, respectively. In an example, the thickness TH is between 50 microns and 100 microns. The dimensions LX, LY and LZ represent the length, the width and the height of glass support member 20.

The glass support member 20 includes an opening (or aperture) 32 that defines a front-end portion 36 of the glass support member that includes the front end 26. The opening 32 also defines a back-end portion 38 of glass support member 20 that includes back-end 28. In an example discussed in greater detail below, opening 32 is formed by processing the medial portion of glass support member 20 to remove material therefrom, e.g., by cutting out a portion of body 21. This process can include laser cutting, laser exposure that induces structural damage and/or an etching process. The opening 32 has a front end 46 at front-end portion 36 and a back end 48 at back-end portion 38. In an example, back-end portion 38 defines a first x-y plane P1 for the glass support member 20. In an example, front-end portion 36 and back-end portion 38 both define (e.g., reside in) the first x-y plane P1.

The glass support member 20 includes at least one cantilever element 50 that extends from the back end 48 of opening 32 generally toward the front end 46 of the opening. Three example cantilever elements 50 are shown in FIG. 1A by way of illustration. In the discussion below, reference is made to a single cantilever element 50 disposed on central axis AC for ease of discussion, but other axes are possible.

The cantilever element 50 has a front-end section 62 that includes a front end 52 closest to front end 46 of opening 32. The cantilever element 50 also has a back-end section 58 closest to back end 48 of the opening. The cantilever element has sidewalls 54. The front-end section 62 a narrowing taper, i.e., the width of the front-end section gets narrower in the x-y plane and in the direction towards front end 52.

As best seen in FIG. 1B, bend region 60 of cantilever element 50 can have an S-shape, as shown. The bend region 60 causes the front-end section 62 of cantilever element 50 to extend in the z-direction with a height hC and defines a z-dimension LZ for glass support member 20 (see FIG. 1B). In an example, front-end section 62 defines a second x-y plane P2 that is displaced from the first x-y plane P1 in the z-direction by the height hC. The front-end section 62 may also be rotated slightly clockwise or counter-clockwise about the y-axis to provide a sloping surface. Alternatively, the front-end section 62 may have downward curve in the x-z plane, as shown in some of the embodiments introduced and discussed below. In an example, the height hC is in the range from 50 microns to 500 microns.

The opening 32 has a length LX' in the x-direction and a length LY' in the y-direction. The width (y-direction) of cantilever element is WC, while the width at front end 52 is WT. The front end 52 is spaced apart from the front end 46 of opening 32 in the x-direction by a distance DC. The width of front-end portion 36 of glass support member 20 in the x-direction is DF while the width in the x-direction of the back-end portion 38 is DB. The cantilever element has an overall length LC in the x-direction as measured between the back end 48 of opening 32 and the front end 52 of the cantilever element.

Example glass materials for glass support member 20 include a flexible glass, such as Corning® Willow® glass, or a borosilicate glass, such as PYREX® glass. Other glasses, including for example chemically strengthened flexible glasses, can also be used. An advantage of using glass to form OE interconnector 20 is that it provides a substantial match to the coefficient of thermal expansions (CTEs) of OE-ICs and OE-PCBs, as discussed below.

Glass support member 20 can be formed from a glass sheet using known techniques for bending glass. In an example, heat is selectively applied to a glass sheet until the glass sheet becomes sufficiently pliable to form bend region 60 in cantilever member 50. The glass sheet is then allowed to cool so that the bend region 60 becomes established (i.e., becomes permanent or fixed) within cantilever member 50.

In other examples, glass support member 20 can be formed by processing a glass sheet using traditional glass-forming processes and glass-shaping processes, such as hot pressing or vacuum forming over a mandrel. The glass support member 20 can also be formed using glass drawing techniques known in the art. Glass drawing techniques allow for the use of a preform that has the same overall shape as the desired shape of glass support member 20 but with larger dimensions. This scaling allows for low cost preforms that can be fabricated to relatively coarse mechanical tolerances (e.g., 25 microns to 50 microns) and then drawn down into very small rod components ("rods") with micron-scale mechanical tolerances. The rods can then be cut to form the basic glass support member 20, which can then be processed to form bend region 60.

Figure 1D:
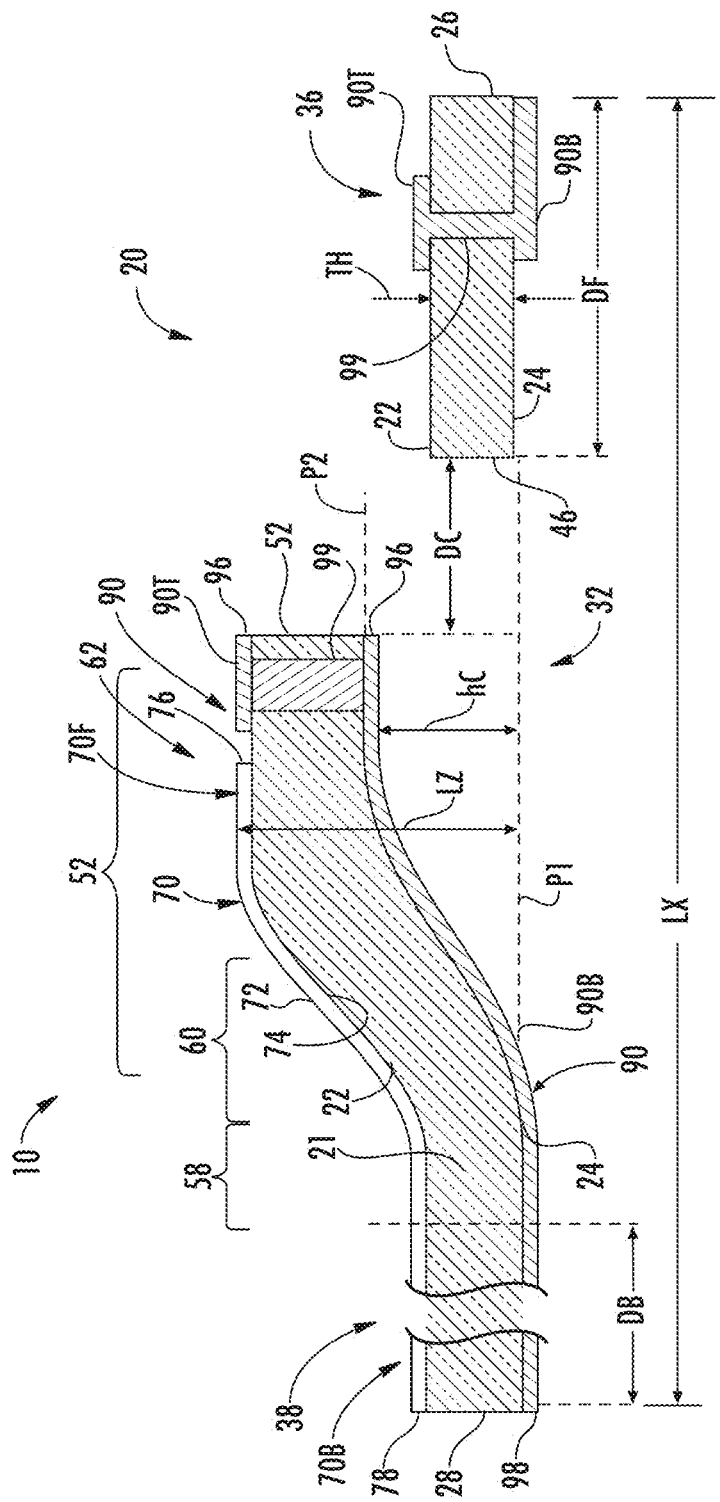
FIG. 1D is a cross-sectional view of the OE interconnector of FIG. 1C.

With reference now to FIG. 1C and FIG. 1D, the OE interconnector 10 includes at least one interconnector optical waveguide ("waveguide") 70 supported by the cantilever element 50 within the body 21 of glass support member 20. In an example, waveguide 70 comprises a buried waveguide over at least a portion of its length. The OE interconnector 10 also includes one electrical conductor 90 supported by the glass support member on cantilever element 50, e.g., the same cantilever element at waveguide 70 or on a different cantilever element, such as shown in FIG. 1D. The discussion below refers to a single waveguide 70 and a single electrical conductor 90 for ease of discussion and it will be understood that the discussion relates equally to multiple waveguides and multiple electrical conductors arranged in parallel. Also in the discussion below, the waveguide 70 is sometimes referred as "interconnector waveguide" to distinguish between other waveguides introduced and discussed below.

The electrical conductor 90 can be formed by depositing a patterned conducting film the top and/or the bottom surface of the glass support member 20. In an example, the electrical conductor 90 can be made of metal, but other non-metal conducting films (e.g., ITO) can also be used. In an example, a masking process can be used to deposit electrical conductor 90. Electrical conductor 90 can be formed using an electroplating process or an electroless plating process. An example material for electrical conductor 90 is copper. The electrical conductor 90 can take on different forms and sizes, and by way of example can constitute a wire, a contact pad, solder bump pad, etc.

Waveguide 70 includes a top side 72, a bottom side 74, a front end 76 and a back end 78. Likewise, electrical conductor 90 includes a front end 96 and a back end 98. In an example, electrical conductors 90 are formed on respective portions of both the top surface 22 and bottom surface 24 of glass support member 20. The electrical conductor 90 that resides on top surface 22 is referred to as top-side electrical conductor 90T and the electrical conductor that resides on the bottom surface 24 is referred to as bottom-side electrical conductor 90B.

The waveguide 70 (or a portion thereof) can be formed using techniques known in the art. In one example, waveguide 70 is formed using an ion-exchange process. The ion-exchange process can include employing a masking process on top surface 22 to define the waveguide 70. The masking process can include standard lithographic masking techniques, including laser exposure to define the mask pattern. In an example, a dielectric coating (not shown) can be formed on top surface 22 to define a cladding region for waveguide 70. In an example where waveguide 70 is formed prior to forming bend region 40, a cold-forming process can be used to form bend region 40 to avoid altering the refractive index profile of the ion-exchanged waveguide by heating the glass sheet. In an example, at least a portion of top side 72 of waveguide 70 can coincide with top surface 22 of glass support member 20.

In another example, at least a portion of waveguide 70 can be formed using a laser-writing process, such as described U.S. Pat. Nos. 6,573,026 and 6,977,137, which are incorporated by reference herein. For ease of illustration, waveguide 70 is shown in FIG. 1C with its top side coinciding with top surface 22 of glass support member 20. More generally, waveguide 70 can be formed within body 21 of the glass support member 20 and have a select path therethrough, e.g., so that the top side 72 of waveguide 70 resides beneath top surface 22 of glass support member 20.

In an example, waveguide 70 is formed in body 21 by not removing glass and by not adding glass to the body, e.g., by modifying the existing glass in the body using the aforementioned ion-exchange process and/or laser-writing process.

As illustrated in some embodiments described below, the back-end waveguide section 70B may be formed to reside relatively deep within body 21 of glass support member 20 in back-end portion 38 and then in the front-end waveguide section 70F can come close to top surface 22 at front end 26 to facilitate evanescent coupling to another waveguide of another component, as described in greater detail below. The refractive index profile of waveguide 70 can also be made to vary along the length of the waveguide to facilitate the optical coupling of light to and from the waveguide. Thus in an example, the back-end waveguide section 70B can be thought of as a transmission section where light is transmitted with low loss and the front-end waveguide section 70F can be thought of as a coupling section where optical coupling (e.g., evanescent coupling) to another waveguide or device component occurs. Different techniques can be used to form the transmission section waveguides 70B and the coupling section waveguides 70F. For example, the transmission back-end section 70B of waveguide 70 may be implemented as an ion-exchanged waveguide while the coupling front-end section 70F of the waveguide may be implemented as a laser-written waveguide.

In the example shown in FIG. 1D, conductive (e.g., metalized) vias 99 are used to electrically connect the top-side electrical conductor 90T with the bottom-side electrical conductor 90B at two different locations, namely in cantilever member 50 and at front-end portion 36. The small top-side electrical conductor 90T on cantilever member 50 serves essentially as an electrical contact, e.g., a contact pad. In this embodiment, the front end 76 of waveguide 70 terminates short of the front end 26 of glass support member 20 to make room for the top-side electrical conductor 90T. The electrical connection between the top-side electrical conductor 90T and the bottom-side electrical conductor 90B may also be formed via metallization applied around the outside edge of front end 26.

Photonic Assembly with OE Interconnector

Aspects of the disclosure include using OE interconnector 10 to optically and electrically connect two OE devices, such as an OE-IC to an OE-PCB within a photonic assembly. The discussion below and the corresponding Figures refer to an example embodiment of OE interconnector 10 that includes a single waveguide 70 and a single electrical conductor 90 for ease of discussion and illustration. The systems and methods discussed below are applicable to all of the configurations of OE interconnector 10 disclosed herein, including those that include multiple waveguides 70 (e.g., waveguide arrays) and multiple electrical conductors 90 (e.g., conductor arrays). In the discussion below, an (OE-PCB) and an OE-IC are used by way of example for the two OE devices.

Figure 2A:
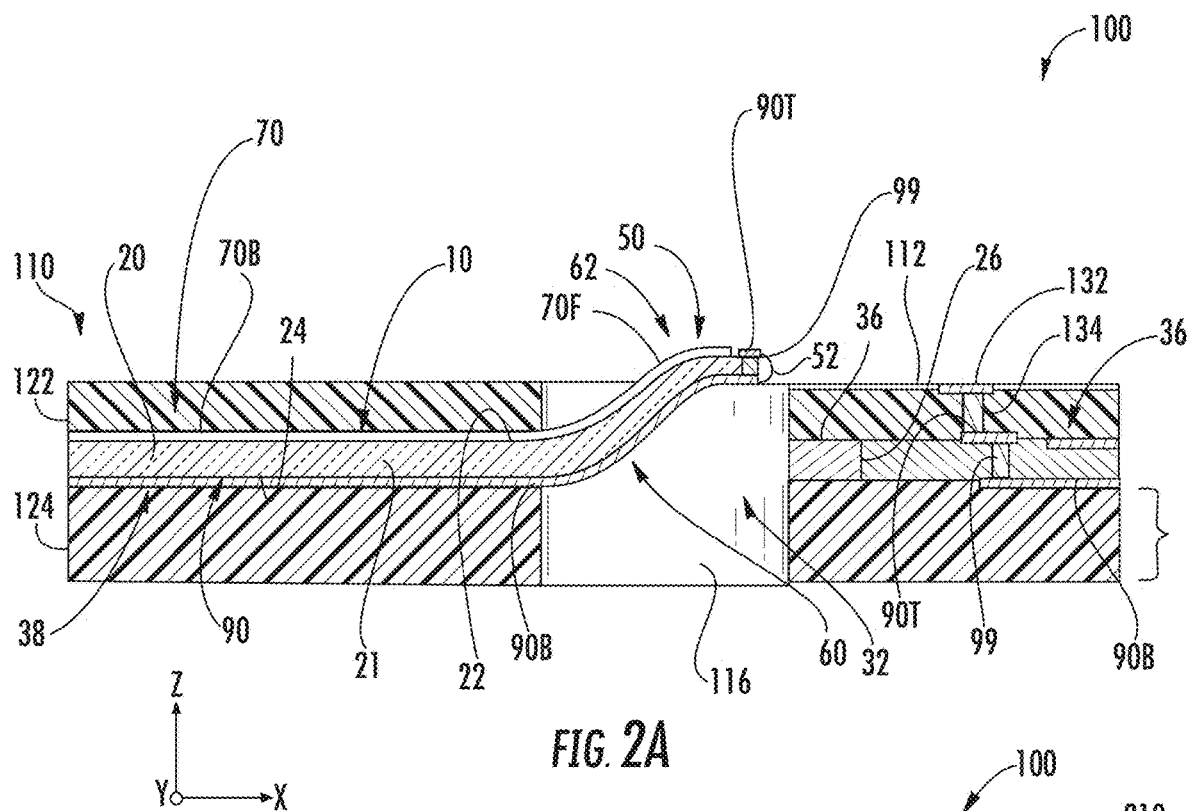
FIG. 2A is a cross-sectional view of a partially assembled photonic assembly that includes an example of the OE interconnector.

FIG. 2A is a cross-sectional view of a partially assembled photonic assembly 100 that includes an example of the OE interconnector 10. The photonic assembly 100 includes an OE-PCB 110 having a top surface 112, bottom surface 114 and a through hole 116 in the top surface that extends between the top and bottom surfaces. In an example, OE-PCB 110 has a layered or laminated configuration that includes a top section 122 that defines top surface 112 and a bottom section 124 that defines bottom surface 114. The OE-PCB 110 also includes electrical conductors in the form of solder bump pads 132 on top surface 112 as well as conductive vias 134 and conductive contacts 136, as shown.

In the example photonic assembly 100 of FIG. 2A, the OE interconnector 10 is operably supported by the OE-PCB 110. In particular, the OE interconnector 10 is supported at back-end portion 38 of glass support member 20 between the top and bottom sections 122 and 124 of the OE-PCB 110 such that the bend region 60 of cantilever element 50 extends into through hole 116. This arrangement places the front-end section 62 of cantilever element 50 just above the top surface 112 of OE-PCB 110, wherein the front-end section 62 of cantilever element 50 is free to flex as needed to obtain alignment as described below.

As noted above, in an example, the top-side and bottom-side electrical conductors 90T and 90B are electrically connected by conductive via 99. Likewise, the front-end portion 36 of OE interconnector 10 can be electrically connected to the top and bottom sections 122 and 124 of the OE-PCB 110 by conductive vias 134 and conductive contacts 136. The OE-PCB 110 is thus configured to provide electrical continuity between the electrical conductors 90 of OE interconnector 10 and the solder bump pads 132 of the OE-PCB. The OE interconnector of FIG. 2A can represent an entire OE interconnector or a portion of an OE connector associated with larger OE-PCB 110.

Figure 2B:
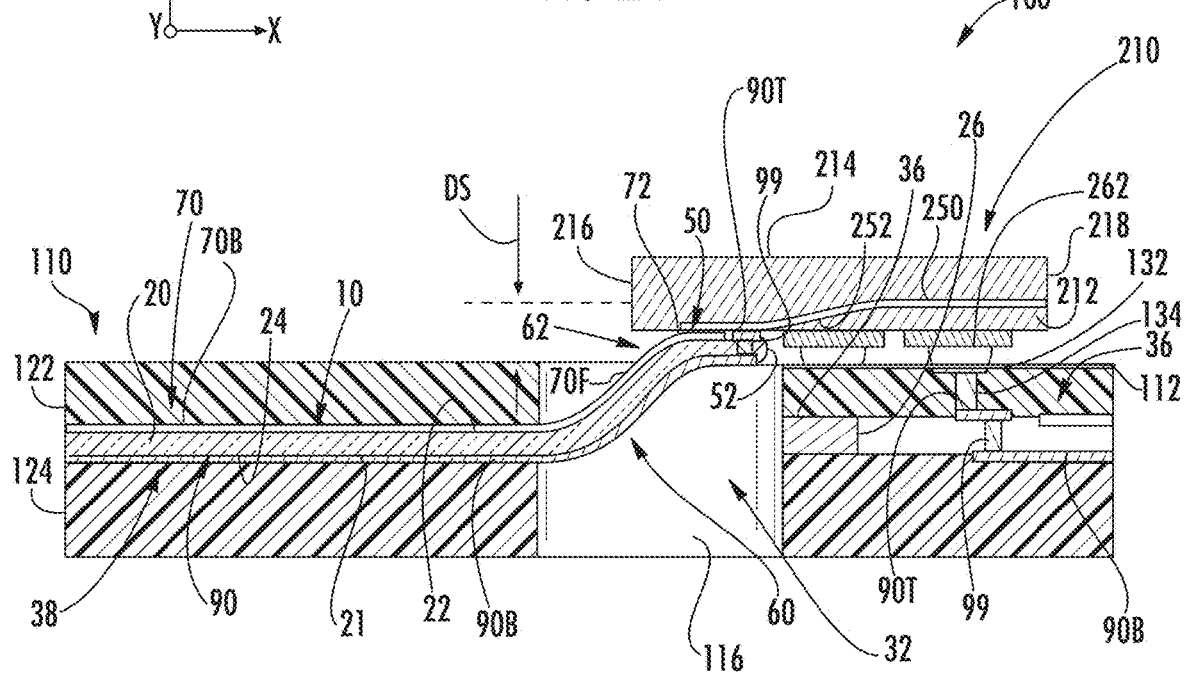
FIG. 2B is similar to FIG. 2A, wherein the photonic assembly additionally includes an OE-IC in a flip-chip configuration and operably connected to the OE-PCB via the OE interconnector.

FIG. 2B is similar to FIG. 2A and shows the photonic assembly 100 as further including an OE-IC 210 operably arranged relative to the OE-PCB 110 and OE interconnection 10. The OE-IC has a top surface 212, a bottom surface 214, a front end 216 and a back end 218. The OE-IC 210 includes at least one waveguide ("device waveguide") 250, which in an example is formed on top surface 212. The device waveguide 250 has a top surface 252 and front end 252. The top surface 212 also includes conductive elements 232. Since the OE-IC 20 is an OE device, the device waveguide can also be more generally referred to as an OE device waveguide.

FIG. 2B shows an example where the OE-IC 210 is operably arranged with OE-PCB 110 in a flip-chip configuration wherein the top surface 212 of the OE-IC faces the top surface 112 of the OE-PCB 110. In an example, the photonic assembly 100 includes conductive elements 262, such as solder bumps, which are operably disposed and in contact with the solder bump pads 132 of the OE-PCB and conductive elements 232 of the OE-IC 210. The conductive elements 262 also can be used to define a stand-off distance DS between the OE-PCB 110 and the OE-IC 210.

The OE-IC 210 is disposed such that the top surface 252 of device waveguide 250 is disposed immediately adjacent the top side 72 of the waveguide 70 of the OE interconnector 10 so that light can be coupled between the two waveguides via evanescent coupling. Meanwhile, the OE-IC 210 and the OE interconnector 10 are electrically coupled at the front-end portion 36 of the OE interconnector by the aforementioned conductive vias 134, conductive contacts 136 and conductive elements 262 as shown, thereby defining an electrical path between the OE-PCB 110 and the OE-IC 210.

Photonic Assembly with OE Interconnector Used as Glass Interposer

Figure 3A:
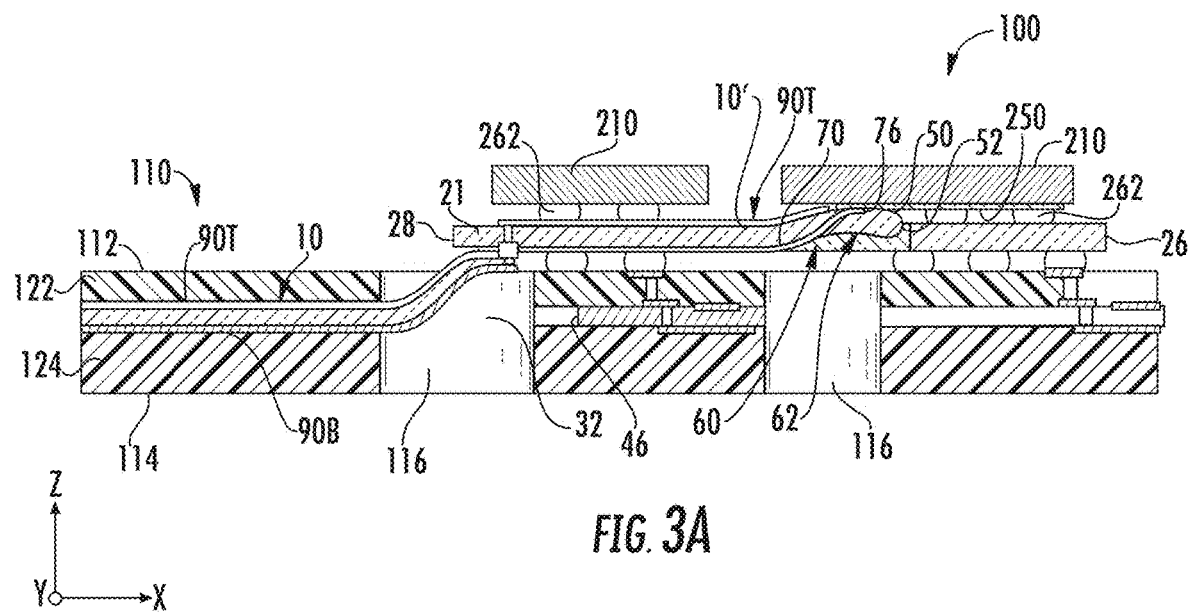
FIG. 3A is a schematic diagram of an example photonic assembly wherein an OE interconnector is configured to be used as a glass interposer that provides optical and electrical interconnections to an OE-IC in a flip-chip configuration.
Figure 3B:
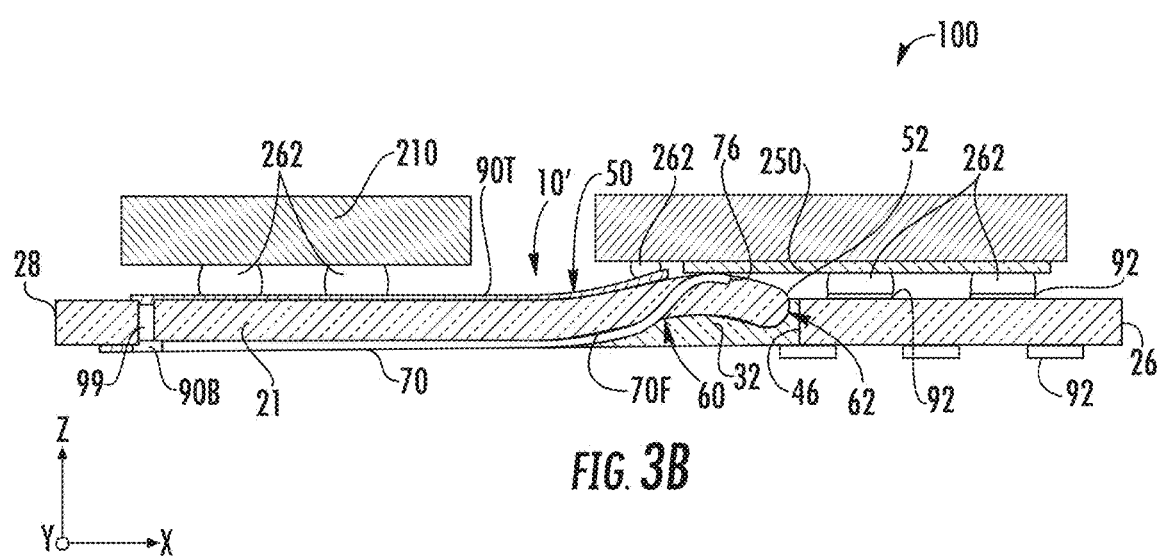
FIGS. 3B and 3C are close-up views of the OE interposer within the photonic assembly of FIG. 3A.
Figure 3C:
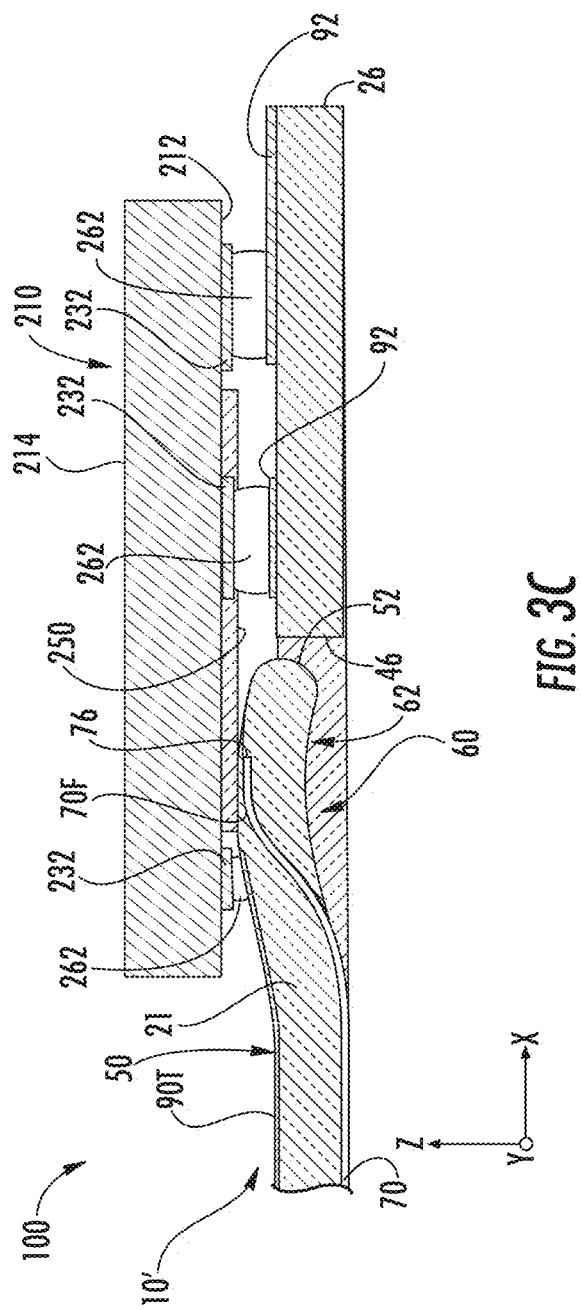

FIG. 3A is a schematic diagram of an example photonic assembly 100 wherein an OE interconnector 10 is configured to be used as a glass interposer that provides optical and electrical interconnections to an OE IC 210. In the interposer configuration, OE interconnector is referred to as OE interposer 10'. FIGS. 3B and 3C are close-up views of the OE interposer 10' within the photonic assembly 100, which includes an OE IC 210 in a flip-chip configuration. The photonic assembly 100 also includes an OE interconnector 10 such as described above.

The OE interposer 10' is configured with a top-side electrical conductor 90T that extends from back end 28 of glass support member 20 to about halfway through bend region 60. The OE interposer 10' also include an example waveguide 70 that has a back-end section 70B that runs along bottom surface 24 from back end 28 to about halfway through the bend region 90. The example waveguide 70 also includes a front-end section 70F that traverses the body 21 of glass support member and runs along a short portion of top surface 22 in front of where top-side electrical conductor 90 ends. The front-end waveguide section 70F can be formed to include a taper to facilitate evanescent coupling. In an example, an ion-exchange process forms the back-end waveguide section 70B, while the front-end waveguide section 70F is formed using a laser writing process.

The OE interposer 10' also includes solder bump pads 92 on the top and bottom surfaces 22 and 24 of glass support member 20 to enable flip-chip bonding of at least one electronic (i.e., non-optical) integrated-circuit chip (IC) 300. Solder bump pads 92 on the bottom surface 24 of glass support member 20 allow the OE interposer 10' to be mounted directly to the OE PCB 110 via solder bump reflow.

The configuration of the photonic assembly 100 of FIG. 3A shows the OE interposer 10' electrically coupled to the OE PCB 110 via solder bumps 262 and optically and electrically coupled to the OE interconnector 10 supported by the OE PCB in the configuration as shown and described above in connection with FIGS. 2A and 2B. The front-end waveguide section 70F of the OE interposer 10' resides immediately adjacent device waveguide 250 to provide for evanescent coupling between the interconnection waveguide 70 and the device waveguide 250. Meantime, the back-end section 70B of waveguide 70 of OE interposer 10' resides immediately adjacent the top side 72 of waveguide 70 of the OE interconnector 10 for evanescent coupling between the OE interconnector and the OE interposer. Thus, the OE interposer 10' serves to optically connect the OE interconnector 10 supported by the OE-PCB 110 to the OE-IC 210. The OE interposer 10' also serves to electrically connect the OE-PCB 110 to OE-IC 210 and to IC 300.

Waveguide and Electrical Conductor Configurations on Cantilever Element

Figure 4A:
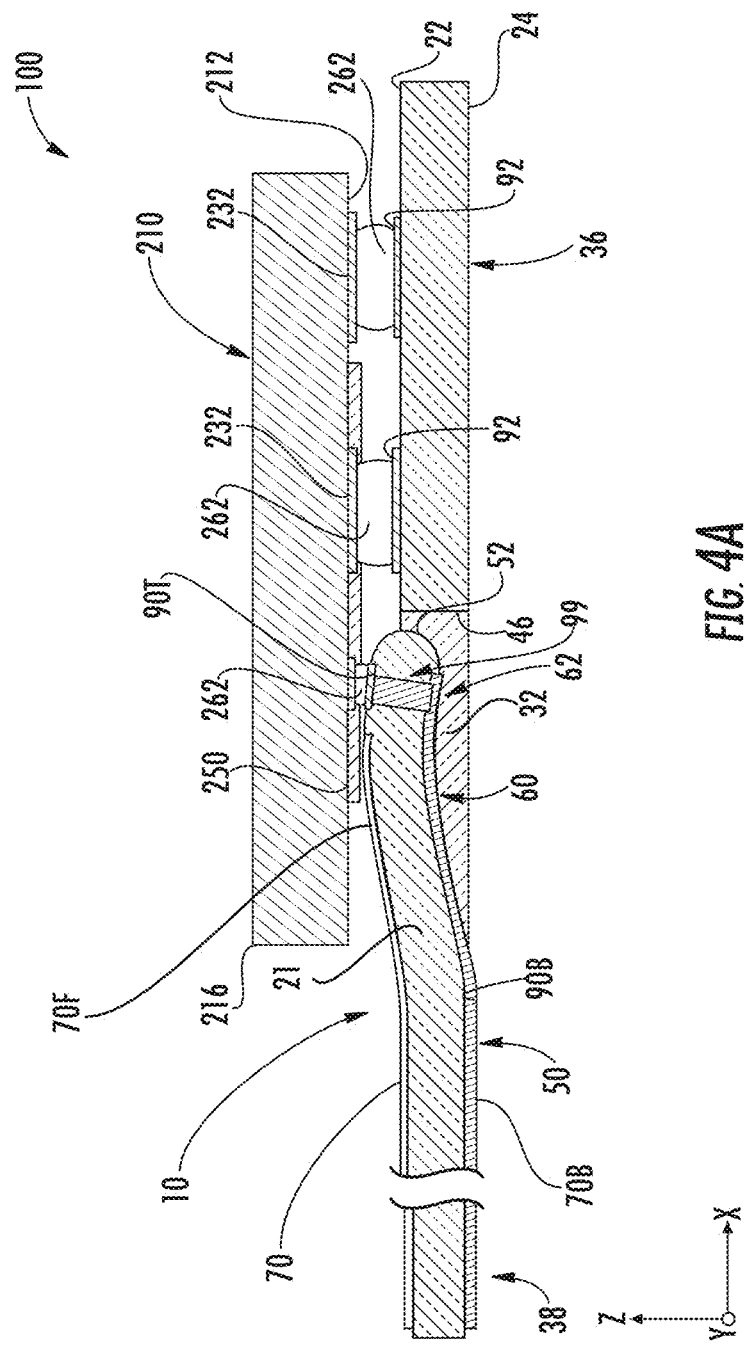
Figure 4B:
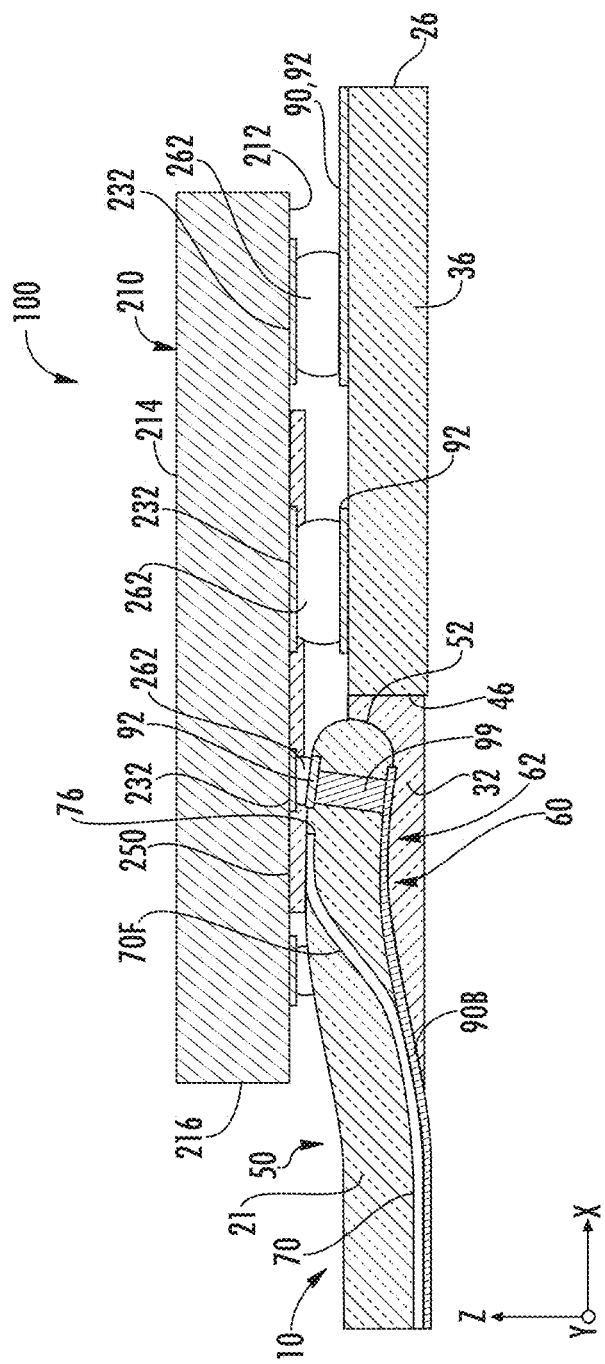

The above examples of OE interconnector 10 and OE interposer 10' include example configurations of waveguides 70 and electrical conductors 90. FIGS. 4A through 4C are close-up side views of an example OE interconnector 10 along with an OE-IC 210 illustrating additional configurations for waveguides 70 and electrical conductors 90 in photonic assembly 100.

FIG. 4A illustrates an example of OE interconnector 10 that includes a bottom-side electrical conductor 90B that serves as a wire and a top-side electrical conductor 90T that serves as an electrical contact. The top side 74 of waveguide 70 at front-end section 70F resides adjacent top surface 22 of glass support member 20.

The top-side and bottom-side electrical conductors 90T and 90B are electrically connected by conductive via 99 at front-end section 62 of cantilever element 50. The conductive via 99 can be fabricated by laser drilling and etching a hole through glass support member 20, and then metallizing the interior walls of the hole. The electrical via 99 can be located anywhere cantilever element 50, and in an example is located at or near the front-end section 62 and in close proximity to the optical coupler as shown in FIG. 4A.

The electrical connection between the top-side conductive element 90T on cantilever element 50 and conductive element 232 on OE IC 210 can be made by using a conductive element 262, such as a solder bump or a conductive adhesive.

The front-end section 62 of cantilever element 50 can be have a curved shape so that when waveguide 70 supported by the cantilever element comes into contact with the OE IC waveguide 250, a small but controllable vertical gap G1 exists between the conductive element 90 of the OE interconnector 10 and the conductive element 262 of the OE-IC 210.

The close proximity of the conductive elements 90 and 232 of the OE interconnector 10 and OE IC 210 at front-end section 62 of cantilever element 50 helps to mechanically stabilize the optical coupling between the interconnection waveguide 70 and the device waveguide 250 when shear forces are applied to the interface between the two waveguides during assembly and use.

FIG. 4B is similar to FIG. 4A and shows an example where the back-end section 70B of waveguide 70 resides adjacent the bottom surface 24 in back-end portion 38 of glass support member 20 and then traverses the body 21 of the glass support member at bend region 60 so that the front-end section 70F of the waveguide resides adjacent the top surface 22 at front-end section 62 of cantilever element 50. The cantilever element 50 supports both top-side and bottom-side electrical conductors 90, which can include wires and contact pads.

FIG. 4C is similar to FIG. 4B and illustrates an embodiment wherein the glass support member 20 supports two top-side and bottom-side waveguides 70, wherein the bottom-side waveguide is as shown in FIG. 4B and transitions to the top surface 22 at a front-end section 70F so that both of the waveguides have front-end sections at the top surface. Creating waveguides 70 at variable depths within body 21 of the cantilever element 50 of glass support member 20 enables optical connections to be made from cantilever front-end section 62 to two or more waveguides 70.

Turning Structures

In the example OE interconnectors 10 described above, evanescent coupling was employed to couple light from the interconnection waveguide 70 to the device waveguide 250. In other examples, the OE interconnector 10 employs a turning structure 400 (introduced below) to re-direct light so that it can provide a normal-incident optical interconnection to a photonic device such as a light emitter, a light detector or a light coupler (e.g., a grating coupler). The turning structure 400 can be formed in one dimension (1D) or two dimensions (2D) to accommodate an array of waveguides 70 and an array of photonic devices. The 1D and 2D coupling locations can be staged or offset away from fixed pitch standard 1D line or 2D mesh locations to better accommodate optimal placement of photonic devices on OE IC 240 (e.g., for consideration of thermal dissipation, signal routing, or semiconductor processing uniformity).

FIG. 5A is a close-up elevated view of front-end section 62 of cantilever element 50 and OE IC 210. The OE IC 210 includes a photonic device 240 on top surface 212, with the photonic device being optically coupled to waveguide 70 of OE interconnector through a turning structure 400. The photonic device 240 can be an active device, such as a light source (e.g., a vertically-emitting laser source, such as a VCSEL) or a light sensor or detector (e.g., a broad area detector). The photonic device 240 can also be passive, such as a waveguide grating coupler or right-angle bend or TIR mirror coupled to a surface waveguide.

In FIG. 5A, the turning structure 400 is in the form of a total-internal-reflection (TIR) surface 410 formed at the front end 52 of cantilever element 50. The TIR surface 410 is angled such that that light 402 incident upon the TIR surface undergoes TIR and is directed to photonic device 240. The direction of travel of light 402 can be reversed, i.e., can be emitted by the photonic device and undergo TIR at the TIR surface 410 to be directed to the front end 76 of waveguide 70. The TIR surface 410 can be formed on front-end section 62 of cantilever element 50 by laser processing dicing, polishing, drawing, etc.).

The waveguide 70 can be formed so that the front-end section 70F includes a bend defined by turning structure 400. In another example, the waveguide 70 terminates at or near turning structure 400, as shown in FIG. 5A.

In an example shown in the close-up side view of FIG. 5B, a lens element 420 is disposed on the top surface 22 of cantilever element 50 in the optical path between turning structure 400 and photonic device 240 to facilitate optical coupling between waveguide 70 and the photonic device. The lens 420 may be formed by applying additional material to glass support member 20 at cantilever element 50 on top surface 12 such as deposited glass or polymer dielectrics. Alternatively, the lens element 420 can be formed by modifying the top surface 22 of cantilever element 50, such as by forming a laser-induced "bump." An example technique for forming laser-induced bumps is described in U.S. Pat. No. 8,397,537, entitled "Method for local reversible glass swelling," and in U.S. Pat. No. 9,359,252, entitled "Methods for controlled laser-induced growth of glass bumps on glass articles," which patents are incorporated by reference herein. The lens element 420 may also be formed by removing material from cantilever element 50, via, for example masked etching processes that creates a curved or diffractive/binary optic lens.

Figure 5C:
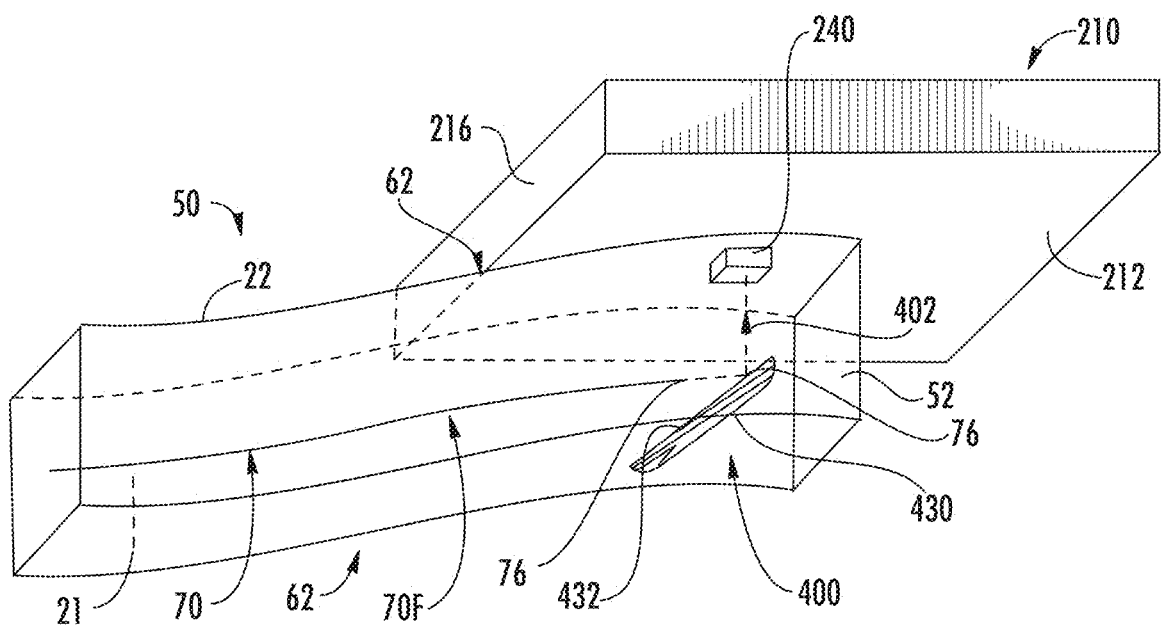
FIG. 5C is similar to FIG. 5A and shows an example of a turning element in the form of a planar reflecting surface formed within the body of the cantilever element.

FIG. 5C is similar to FIG. 5A and shows an example turning structure 400 defined by an angled flat surface 430 within body 21 of cantilever element 50. The angled flat surface 430 can be formed by creating an air-filled internal cavity 432 within the body 21 of cantilever element 50. After cavity fabrication, a glass etching process can then be used to ensure that all critical internal surfaces are smooth to minimize scattering losses. The laser etching process can also be used to create lens 420 as discussed above. It is noted that the angled flat surface 430 is a TIR surface.

The laser written and etched internal cavity 432 can be formed prior to, during, or after laser-based formation of waveguide 70, potentially using the same laser with different parameter settings (e.g., pulse power, duration, and repetition period and cycles). This approach ensures that the laser written and etched internal cavities are precisely aligned with coupling region laser written waveguides within the glass cantilever element tip.

Figure 5D:
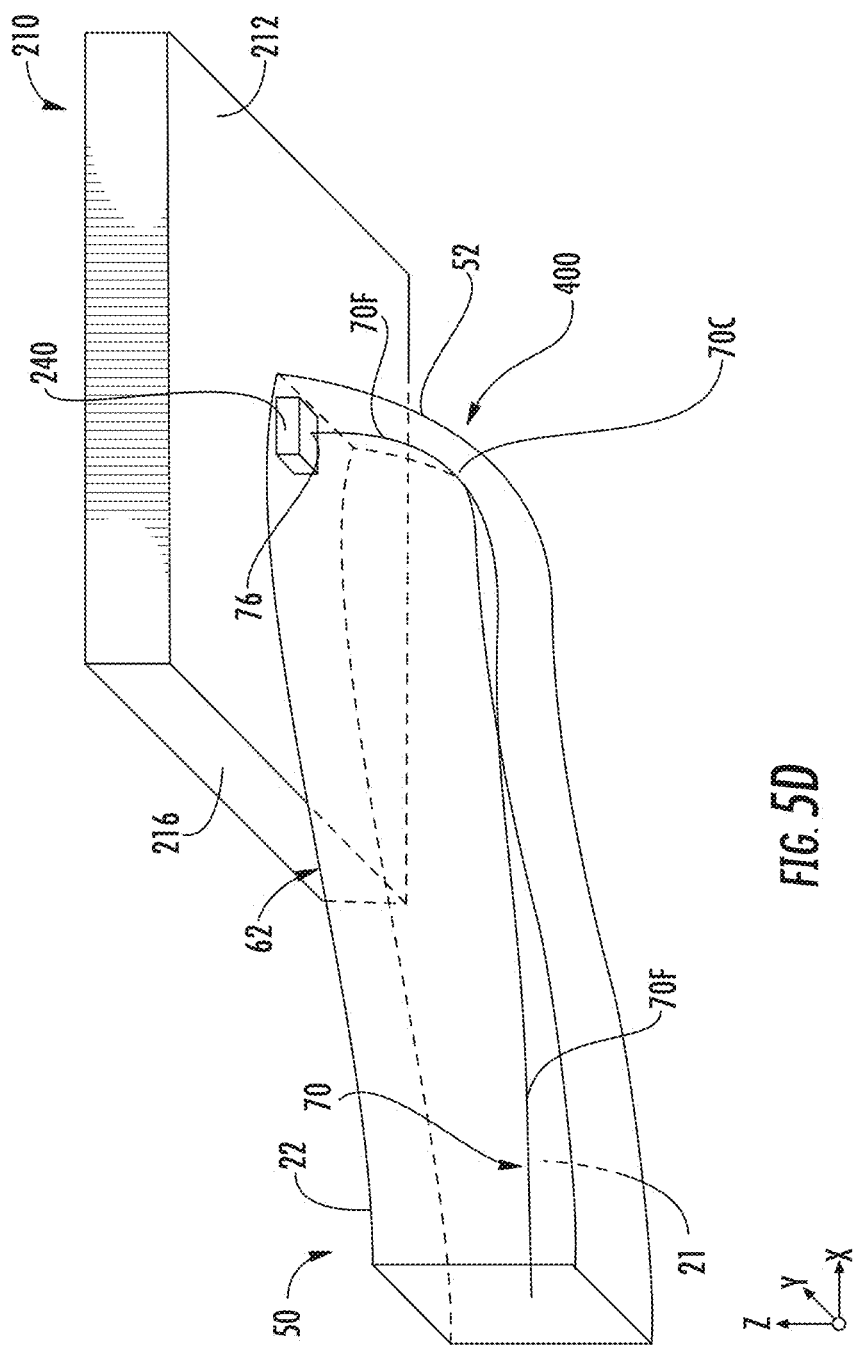
FIG. 5D is similar to FIG. 5A and shows an example of a turning element in the form of a curved section formed in the optical waveguide supported by the cantilever element.

FIG. 5D is similar to FIGS. 5A and 5B and illustrates an example turning structure 400 defined by a curved portion 70C of waveguide 70 in front-section 70F. The curved portion 70C can follow a similarly curved front-end section 62 of cantilever member 50. In an example, the curved portion 70C defines a substantially 90 degree bend in waveguide 70. In an example, the curved portion 70C of waveguide 70 resides between 5 μm and 10 μm from bottom surface 22 or from front end 52 of cantilever element 50. In an example, the curved surface at front-end section 62 is includes a coating 440 of dielectric material have a refractive index less than the (core) refractive index of waveguide 70. The low-index coating can make for stronger waveguiding around curved portion 70C, thereby reducing bending loss. The low-index coating can also reduce scattering loss.

Figure 5E:
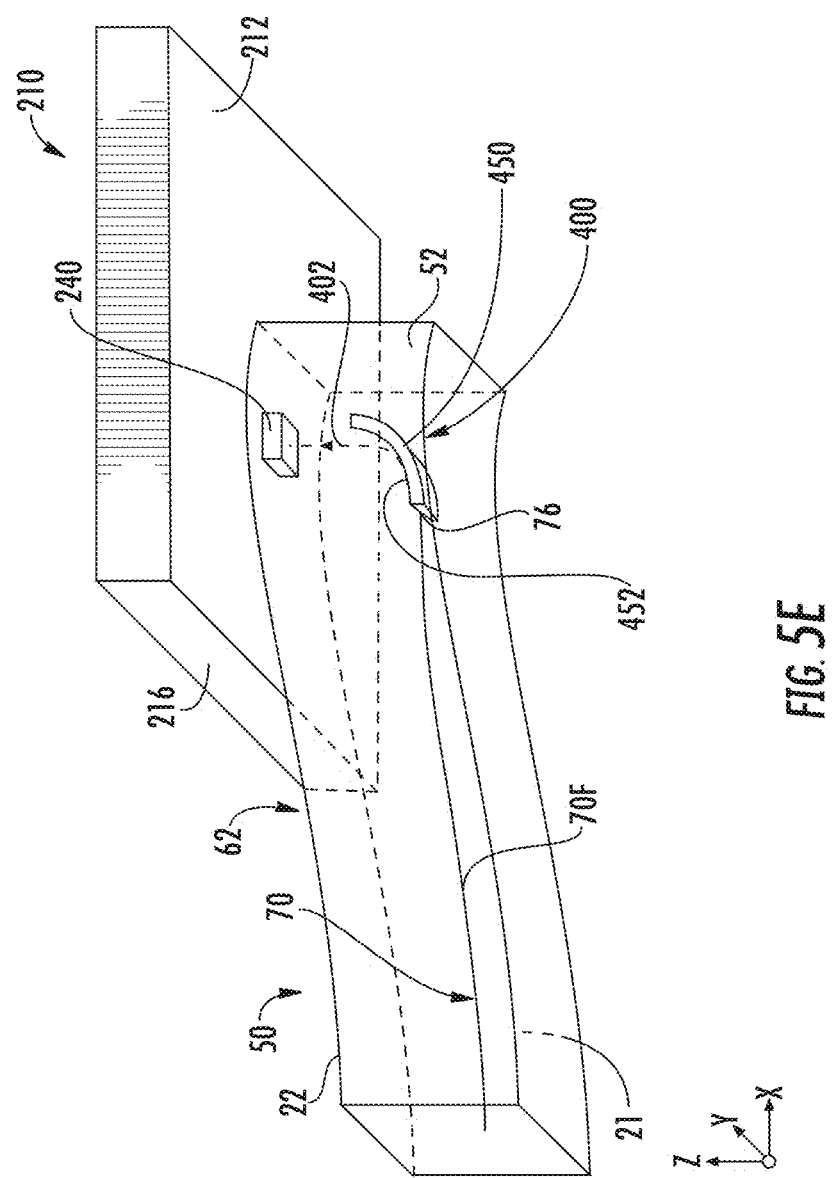
FIG. 5E is similar to FIG. 5A and shows an example of a turning element in the form of a curved reflecting surface formed within the body of the cantilever element.

FIG. 5E is similar to FIG. 5D and illustrates an example turning structure 400 that utilizes an internal curved surface 450 internal to body 21 of cantilever element 50. The curved surface 450 is defined by a curved internal cavity 452, which can be formed in similar manner as internal cavity 432, e.g., by using laser radiation to selectively damage the glass within body 21 and then an etch process to remove the damaged glass. The etching process creates an optically smooth curved surface.

In an example, the curved internal cavity 452 is formed in close proximity to the outside of curved portion 70C of waveguide 70 to enhance the confinement of guided light propagating around the curved portion. The curved internal cavity 452 can also be filled with a material with an index of refraction lower than glass but higher than air to control the degree of optical confinement versus the bend loss due to any internal cavity surface roughness that might exists after etching.

Figure 5F:
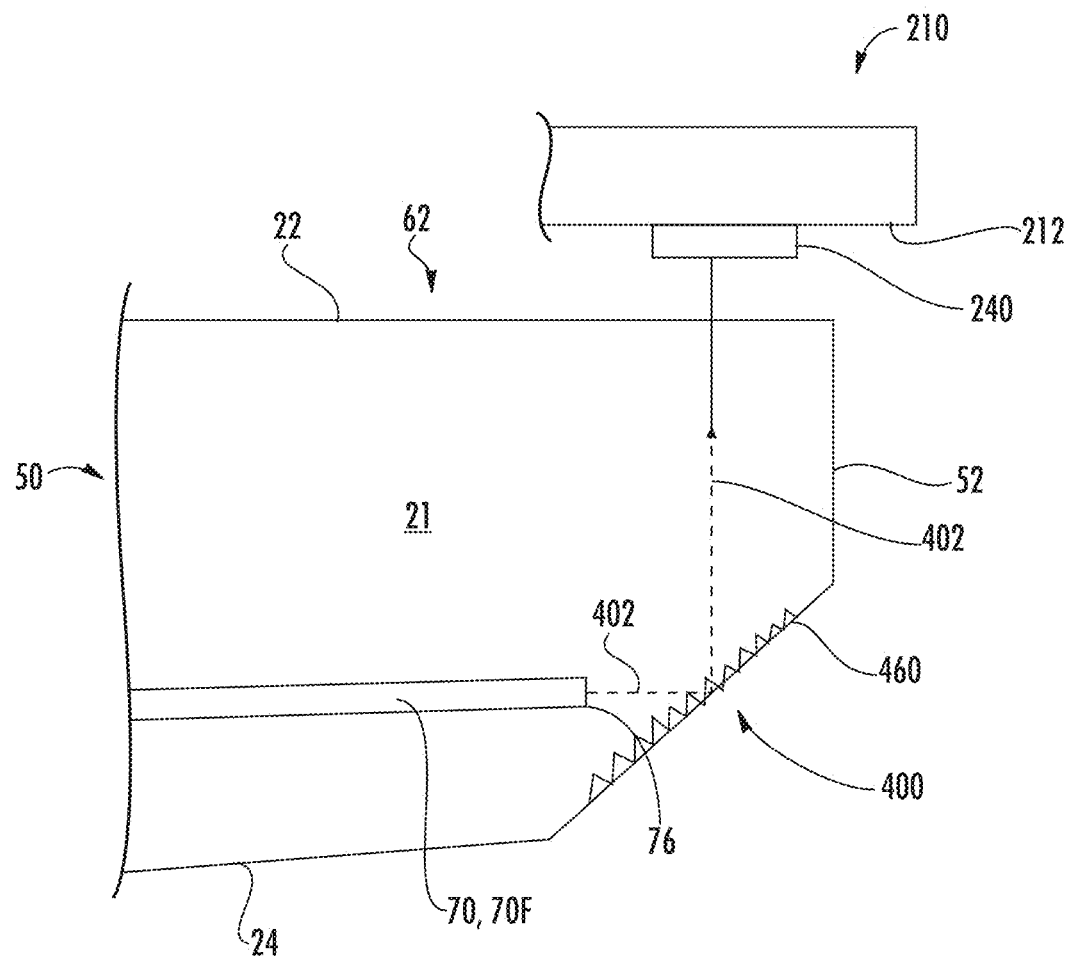
FIG. 5F is a side view similar to FIG. 5B and shows an example embodiment wherein the turning structure is formed from a grating coupler.

FIG. 5F is similar to FIG. 5B and shows an example embodiment wherein the turning structure is formed from a grating coupler 460 formed immediately adjacent the top side 72 of waveguide 70 at front-end section 62 to redirect guided light 402 traveling in waveguide 70 to be incident upon photonic device 240 residing adjacent waveguide 70 at the tip of the cantilever element.

Methods of Forming Cantilever Member of OE Interconnector

Figure 6A:
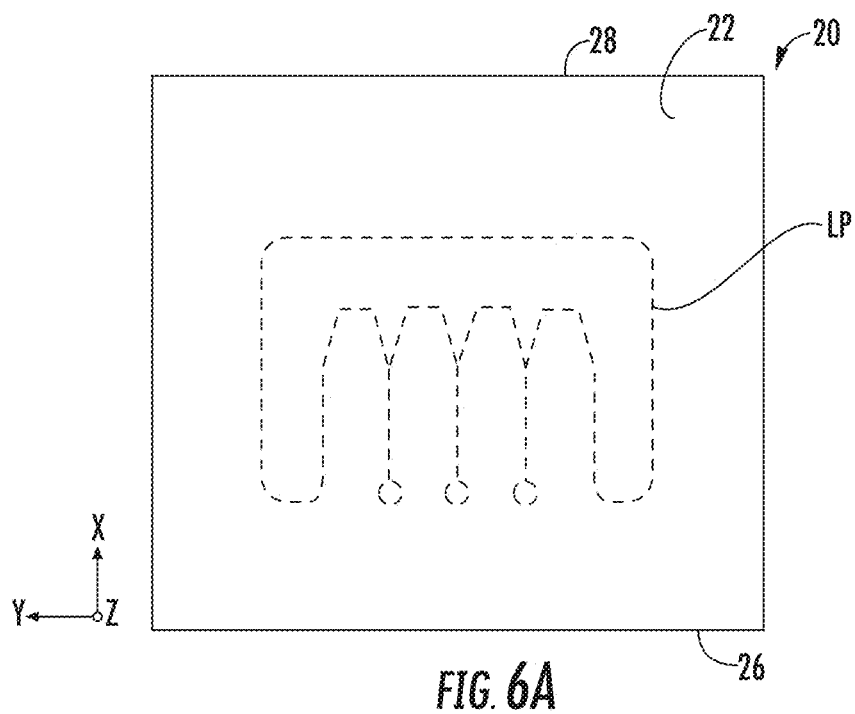
FIG. 6A is a top-down view of a glass sheet that shows an outline of a path (dotted line) traced out by a cutting laser to form the glass support member of FIG. 1A.

The cantilever elements 50 of glass support member can be formed by a laser writing process followed by an etching process. FIG. 6A is a top-down view of a glass sheet 20S that shows the outline LP of the path (dotted line) traced out by a cutting laser (the "laser path") to form the glass support member 20 of FIG. 1A. In this configuration, there are four cantilever elements 50 defined by the same laser writing process. The cantilever elements 50 are flexible and so can be used to form OE interconnector 10 that has improved optical coupling to device waveguides 250 of OE-IC 210 by accommodating angular tilt misalignment between the plane of the glass support member 20 and the plane of OE-IC.

The front-end section 62 of the cantilever element 50 can be made in an arbitrary shape. In FIG. 6A, the front-end section 62 is tapered in the x-y plane to aid in its alignment to mating features on OE IC 210 or OE interposer 10'. In an example, inside corners are rounded, and circular regions are created at the ends of the paths between cantilever elements for stress relief.

After laser exposure, the glass sheet 20S is etched so that the laser path LP illuminated by the laser beam is preferentially etched away, thereby forming the opening 3. The multiple cantilever elements 50 are defined by slots 51 that separate the cantilever elements from each other by a distance DG so that they are independently movable, i.e., flexible.

Figure 6B:
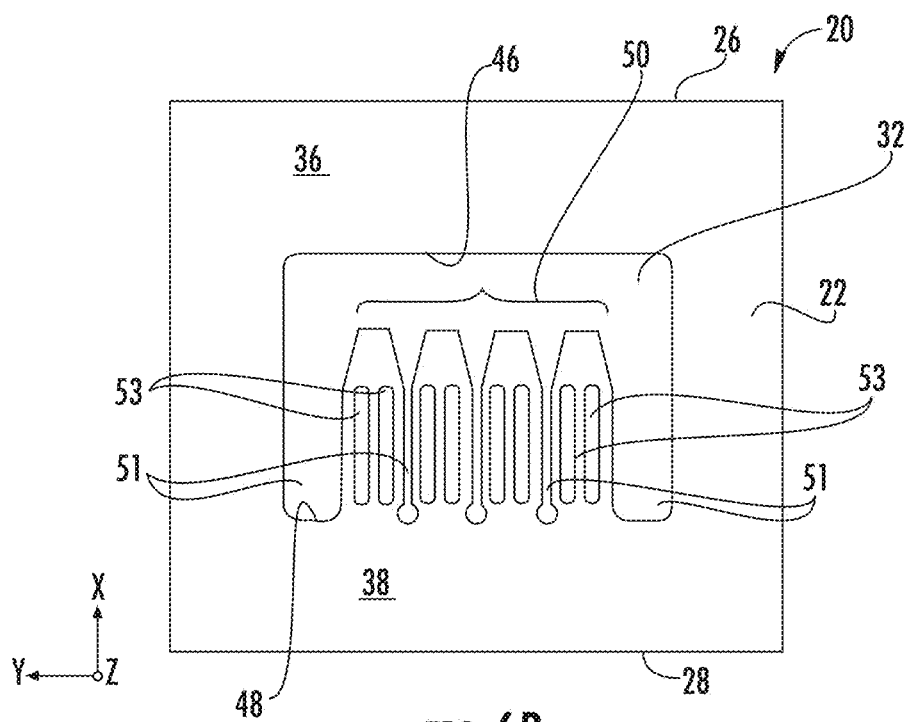
FIG. 6B is similar to FIG. 1A and shows an example where the cantilever elements each includes slots that increase the in-plane flexibility of the cantilever elements.

FIG. 6B is similar to FIG. 1A and illustrates an example where cantilever elements 50 each include one or more slots 53. The slots 53 allow cantilever elements 50 to be flexed (displaced) laterally, i.e., in the x-y plane. This in-plane flexibility provides an extra degree of freedom to accommodate material CTE mismatches and associated shear stresses associated with using dissimilar materials in photonic assembly 100. The flexible cantilever elements 50 may also be useful during alignment, as described in greater detail below.

Laser written and etched latching features (not shown), such as holes, slots, and pits, may be formed in the cantilever element to aid in mechanically restraining it during alignment and attachment processes. For example, a latching feature located near the front-end section 62 of the cantilever element 50 can be engaged by a probe to position the cantilever element during alignment.

Figure 7A:
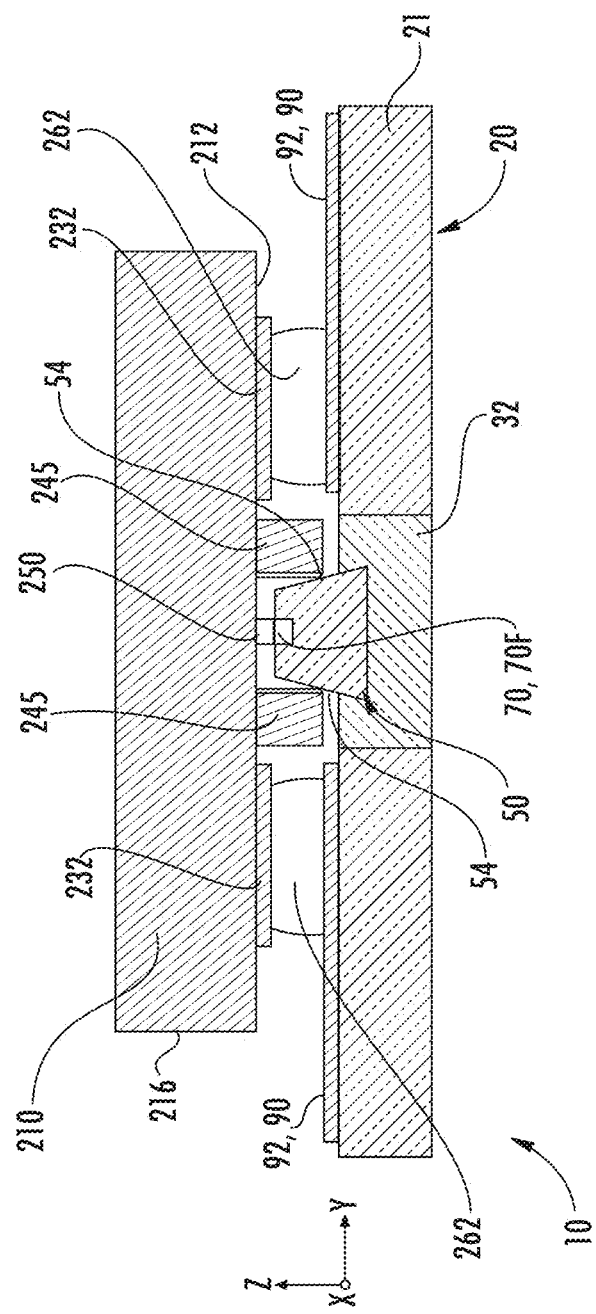
FIG. 7A is a cross-sectional view in the x-y plane of a portion of a photonic assembly illustrating an example of a cantilevered member that has angled sidewalls and wherein the OE-IC has an alignment feature that engages the angled sidewalls.

The glass sheet cutting process can also create cantilever elements 50 with angled sidewalls 54, as shown in the y-z cross-sectional view of FIG. 7A. For example, angled sidewalls 54 can create cantilevered elements 50 that are narrower on the top surface 22 than the bottom surface 24. This variation in the width of cantilever element 50 can be used to help align the front-end section 62 of the cantilever element to raised alignment features 245 (e.g., bosses, walls, ridges, polymer gripper structures) on top surface 212 of OE IC 210.

Figure 7B:
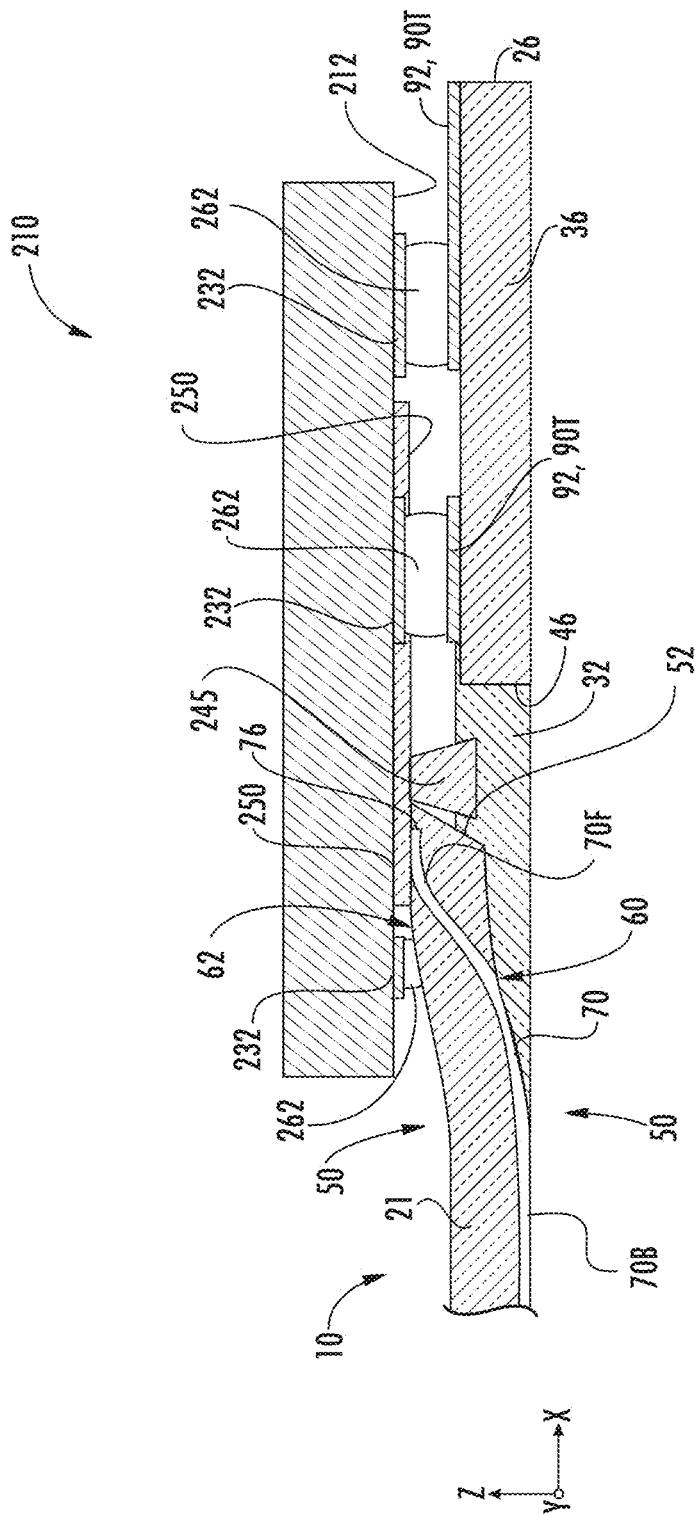
FIG. 7B is a cross-sectional view in the x-z plane of a portion of a photonic assembly illustrating an example where the front end of the tip of the cantilever element includes an angled sidewall that engages an alignment feature of the OE-IC.

FIG. 7B is similar to FIG. 7A and illustrates an example where an angled sidewall 54 at the front-end section 62 of the cantilever element 50 can also be used as a wedge to force the tip down into contact with OE-IC 210 when the tip engages a raised alignment feature 245 on the top surface 212 OE-IC 210. The alignment feature 245 also has an angled sidewall that makes an acute angle with the top surface 212 of OE-IC 210.

Cantilever Element Out-of-Plane Shaping Methods

Out-of-plane shaping of cantilever elements 50 allows waveguides 70 to extend vertically and contact mating device waveguides 250 on flip-chip mounted OE-ICs 210 in photonic assembly 100. The out-of-plane shaping process can be carried out using several methods.

In a first method, cantilever element 50 is heated, e.g., by a laser beam or other radiative heat source (e.g., a halogen lamp through an aperture) so that the cantilever element softens along at least a portion of its length. While the cantilever element 50 is sufficiently hot, force applied to its front-end section 62 causes the cantilever element to be displaced out of the x-y plane. When the cantilever element 50 cools, it retains its out-of-plane shape. An additional annealing process may be required to remove residual stresses in the cantilever element. The result is formation of bend region 60.

In another example method, glass support member 20 can be pressed into a mold that provides precision raised surfaces that correspond to the location of cantilever elements 50. The pressing molds can be fabricated from metal, ceramic, or graphite materials. By controlling the position and height of the raised regions of the mold, the out-of-plane shape of the cantilever element 50 can be accurately controlled. This method has the advantage that all cantilever elements 50 can be shaped in a single process step.

In another example method, a coating material (for example, a glass, a ceramic, or a polymer material) with a different CTE can be locally applied to the cantilever elements 50 while the glass support member 20 is held at an elevated temperature. When the glass support member 20 is cooled, the CTE difference between the coating layer and the glass material causes the cantilever element 50 to deflect upward.

For example, a low CTE material applied to the bottom surface 24 of the cantilever element 50 (or alternatively a high CTE material applied to the top surface 22 of the cantilever element) will cause the cantilever element to curl upward. More complex cantilever element shaping involving both concave and convex surfaces (when viewed from above) can be created by applying coating materials on the top and bottom surfaces 22 and 24 of the cantilever element 50.

The cantilever elements 50 shown and described above have the front section 70F of waveguide 70 at the upper surface 22 at the front-end section 62. To allow the top surface 22 of the front-end section 62 to lay flat against the bottom surface 214 of the OE-IC 210, in one example the cantilever element 50 an S-shaped out-of-plane configuration that includes a concave portion 22CC of upper surface 22 and a convex portion 24CV of lower surface 24, as shown in FIG. 8A.

Figure 8A:
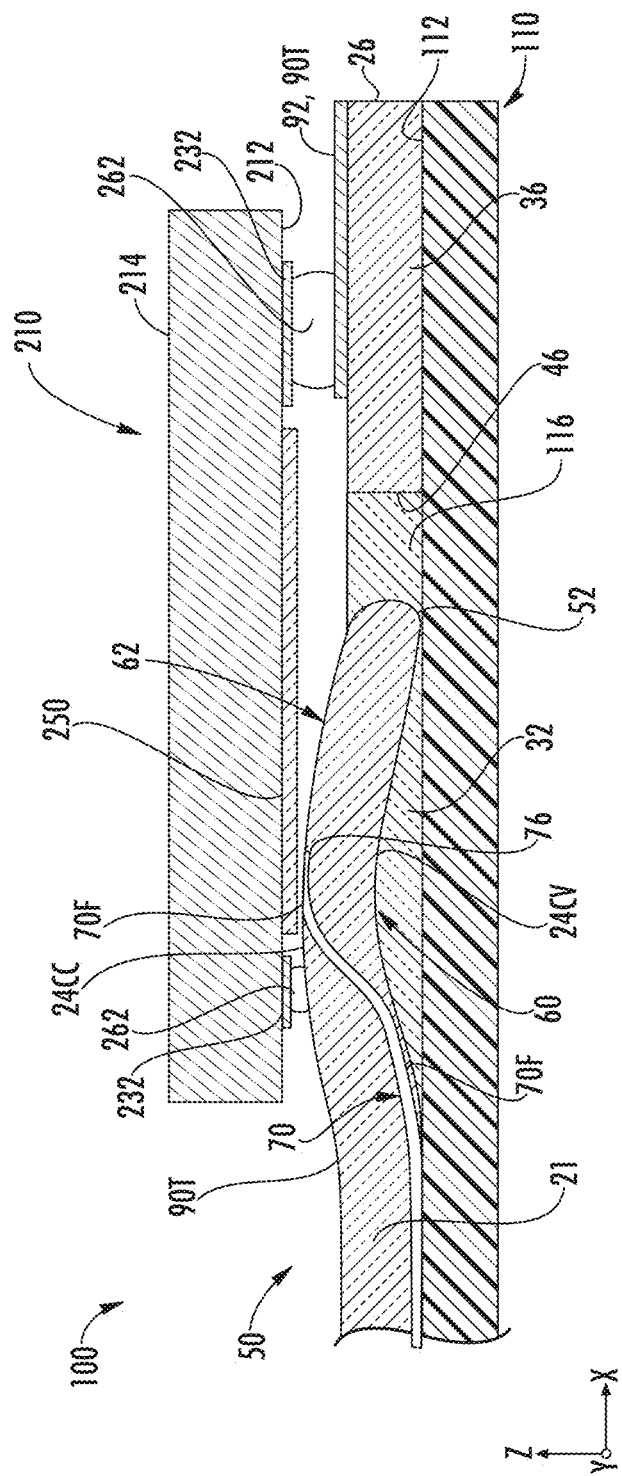
FIG. 8A is a cross-sectional view in the x-z plane of a portion of a photonic assembly that illustrates an example the front-end section of the optical waveguide of cantilever element is positioned at the top surface and near the middle of the cantilever element.

FIG. 8A also shows an example wherein the front-end section 70F of waveguide 70 of cantilever element 50 can be positioned at the top surface 22 at a location near the middle of the cantilever element, i.e., mid-way between the front end 52 and back end 58 in the x-direction. This configuration allows the middle of the cantilever element 50 to be raised so that it makes contact with device waveguide 250 of OE-IC 210, while the front-end section 62 of the cantilever element curves downward and contacts a flat bearing surface 112 of OE-PCB 110 directly below the OE-IC 210. By moving the evanescent coupling location near the middle of the cantilever element 50, the spring constant of the cantilever element can be approximately doubled, thereby increasing the upward force applied on the OE-IC 210 to ensure a robust optical connection during subsequent adhesive attachment processes.

Figure 8B:
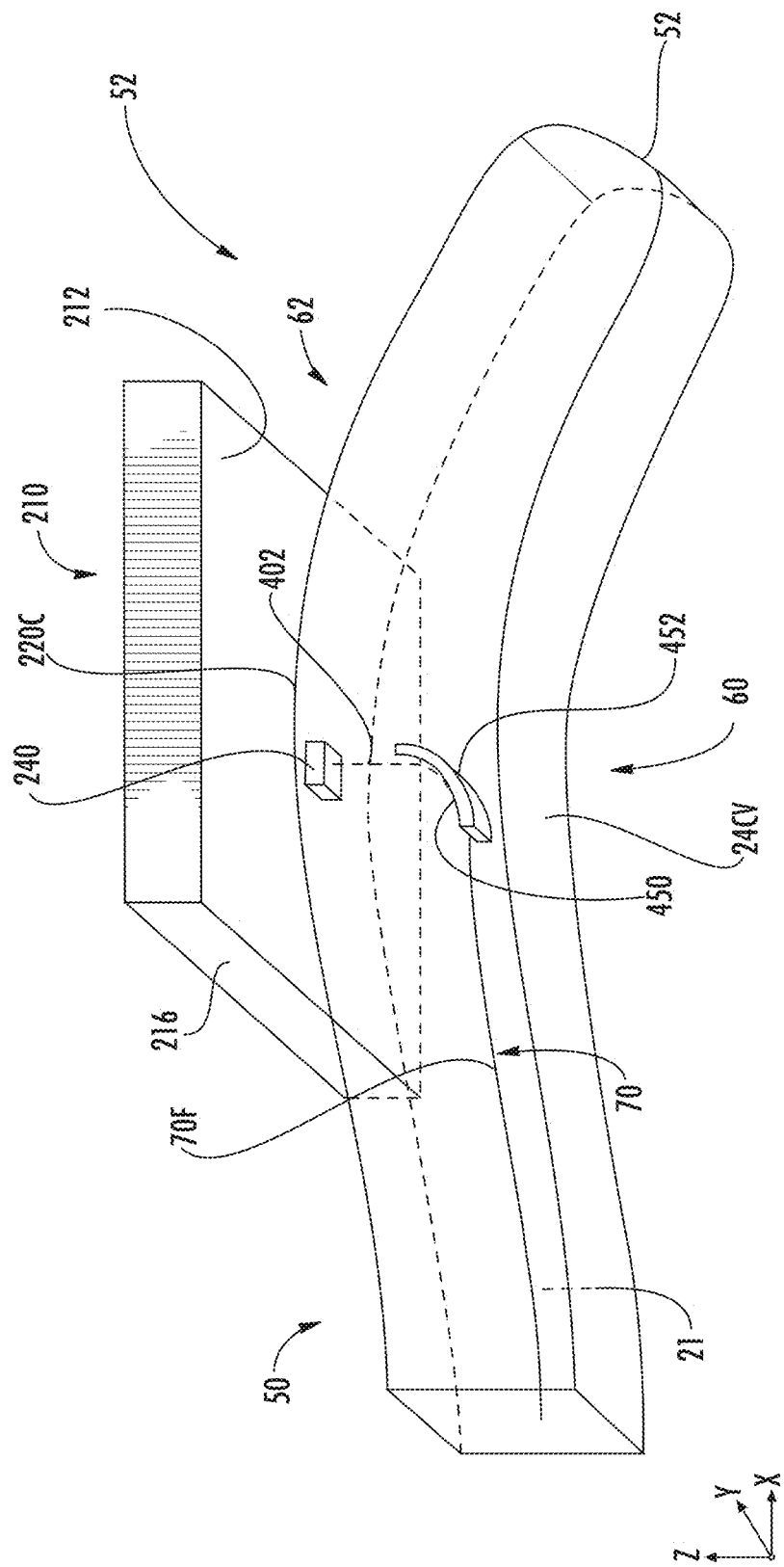
FIG. 8B shows an example of an OE interconnector similar to that of FIG. 5D, wherein the internal curved surface is located at about the middle of the cantilever element and thus away from the tip of the cantilever element.

Mid-cantilever element coupling such as described above can be carried out for both evanescent and normal incidence embodiments of OE interconnector 10. FIG. 8B shows an example of OE interconnector 10 similar to that of FIG. 5D, wherein the internal curved surface 450 defined by internal curved cavity 452 is located at about the center of the middle of cantilever element 50 and thus away from front-end section 62.

Processing of Coupling Region

Waveguide fabrication techniques can be used to alter the depth at which waveguide 70 resides within body 21 of cantilever element 50 at the coupling region, i.e., the part of front-end section 62 where the waveguide optically couples to device waveguide 250 or to another device. Some modification of cantilever element 50 may be needed since laser written waveguides can suffer from shape deformation and variation in index of refraction when created very close to the surface of a glass substrate, e.g., within 3 µm to 5 µm. Ion-exchanged waveguide depth may also be difficult to alter locally to achieve target waveguide depths.

Figure 9A:
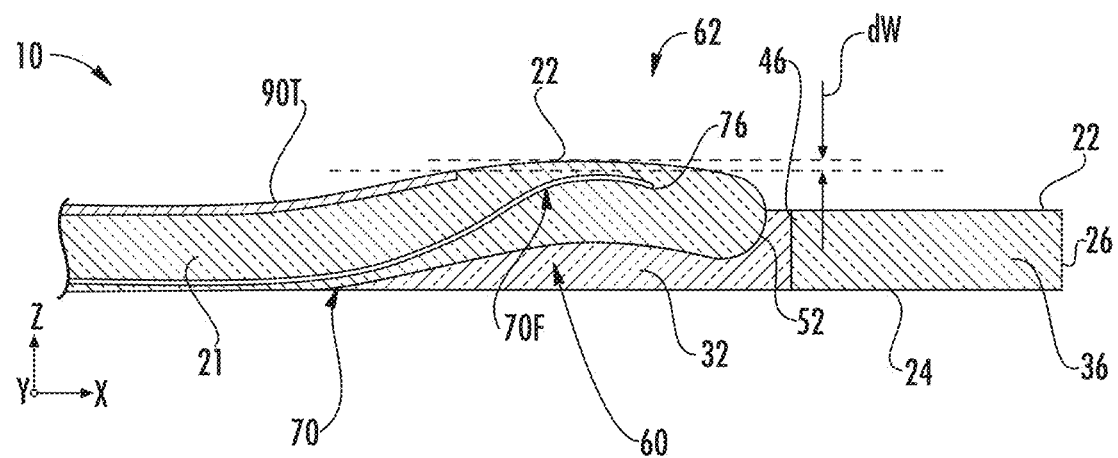
FIG. 9A through 9E illustrate an example processing method wherein a portion of the body of the cantilever element that resides adjacent the top surface is selectively removed so that the optical waveguide resides immediately adjacent the top surface (FIGS. 9A and 9B) or terminates at a step to allow for butt coupling (FIGS. 9C through 9E)
Figure 9B:
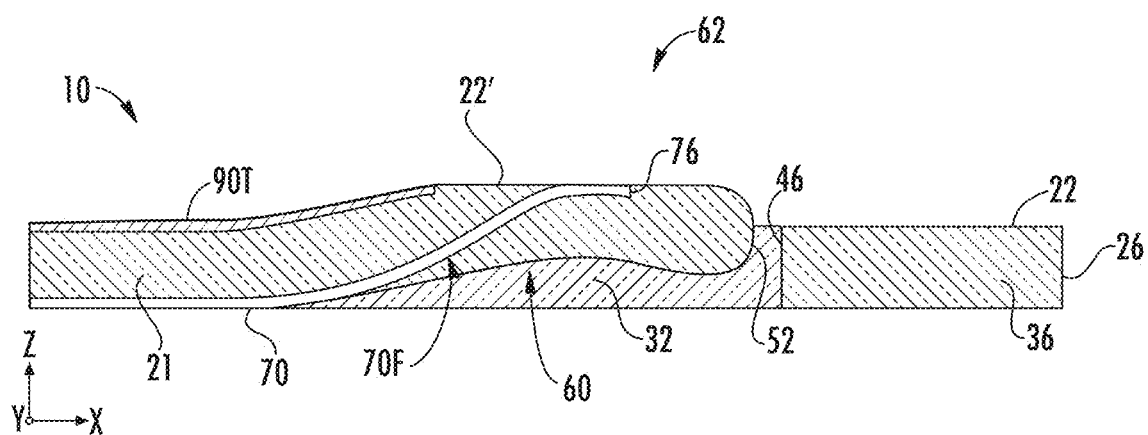

FIGS. 9A and 9B illustrate an example processing method wherein a portion of the body 21 of cantilever element 50 that resides adjacent upper surface 22 is selectively removed at front-end section 62 using for example, mechanical polishing or an etching process. FIG. 9A shows the front-end section 70F of waveguide 70 as initially fabricated in OE interconnector 10 at a location below the top surface 22 of cantilever element 50 (i.e., as a buried waveguide). FIG. 9B shows the same OE interconnector 10 having been processed to selectively remove glass from the top surface 22 of the cantilever element 50 so that the front-end section 70F of previously buried waveguide 70 is located at or closer to the (new) top surface 22' of the cantilever element.

Figure 9C:
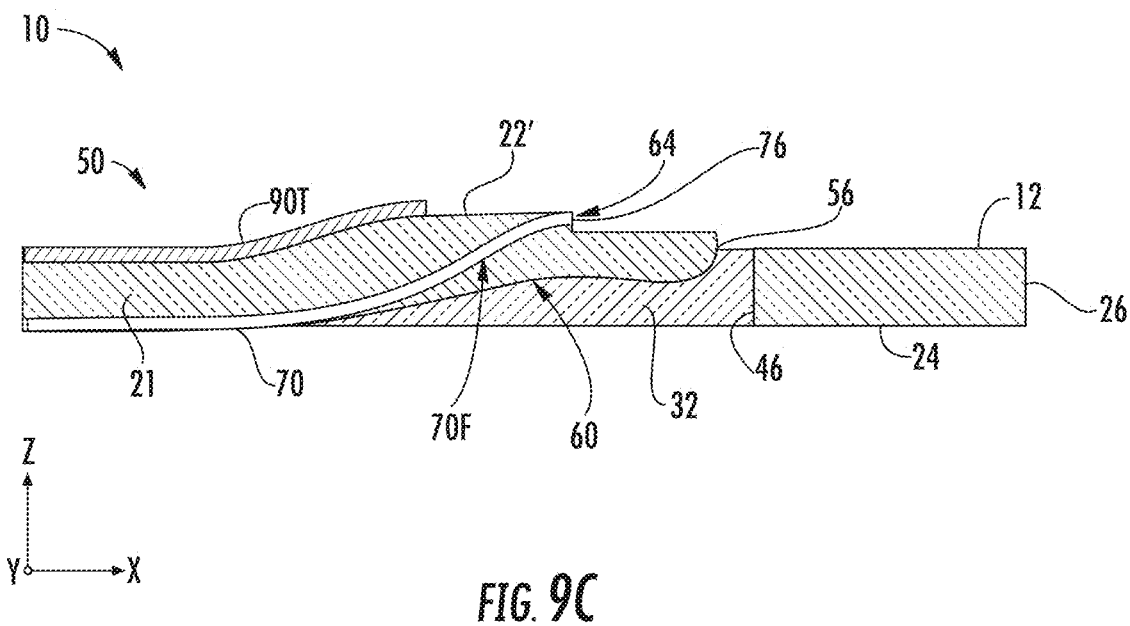

In examples, the material removal operation may produce a flat top surface 22', or the top surface may be curved (for example, upwardly convex) so that the cantilever element 50 makes contact with a subsequently attached OE device at a single location. FIG. 9C is similar to FIG. 9B and illustrates an example wherein the material removal operation removes material over only a portion of front-end section 62 to define a vertical step 64 that exposes the back end 78 of waveguide 70.

Figure 9D:
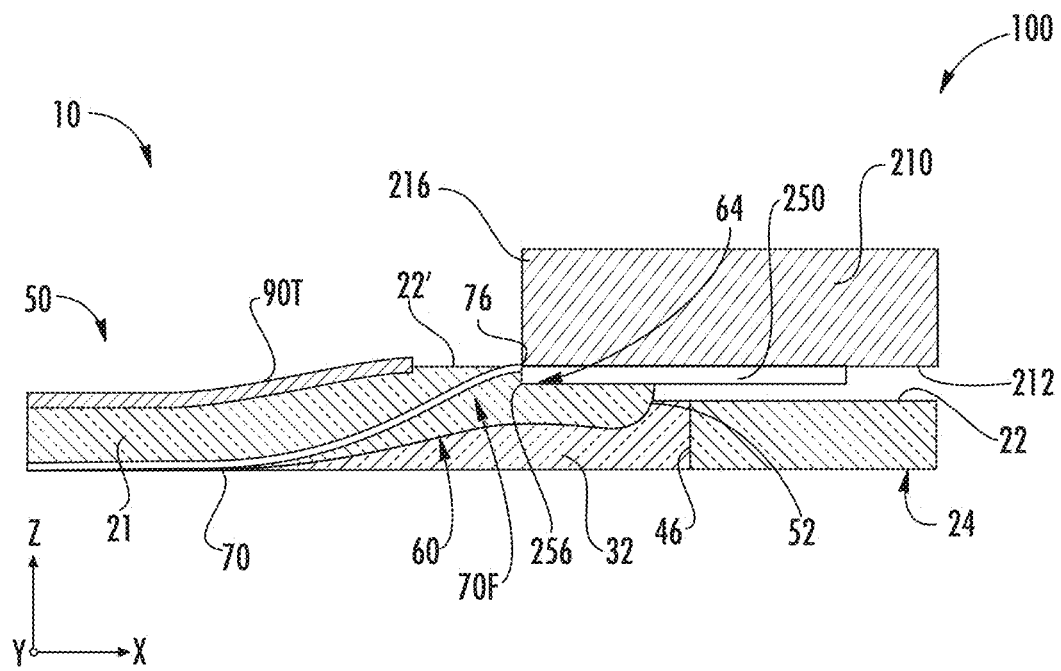
Figure 9E:
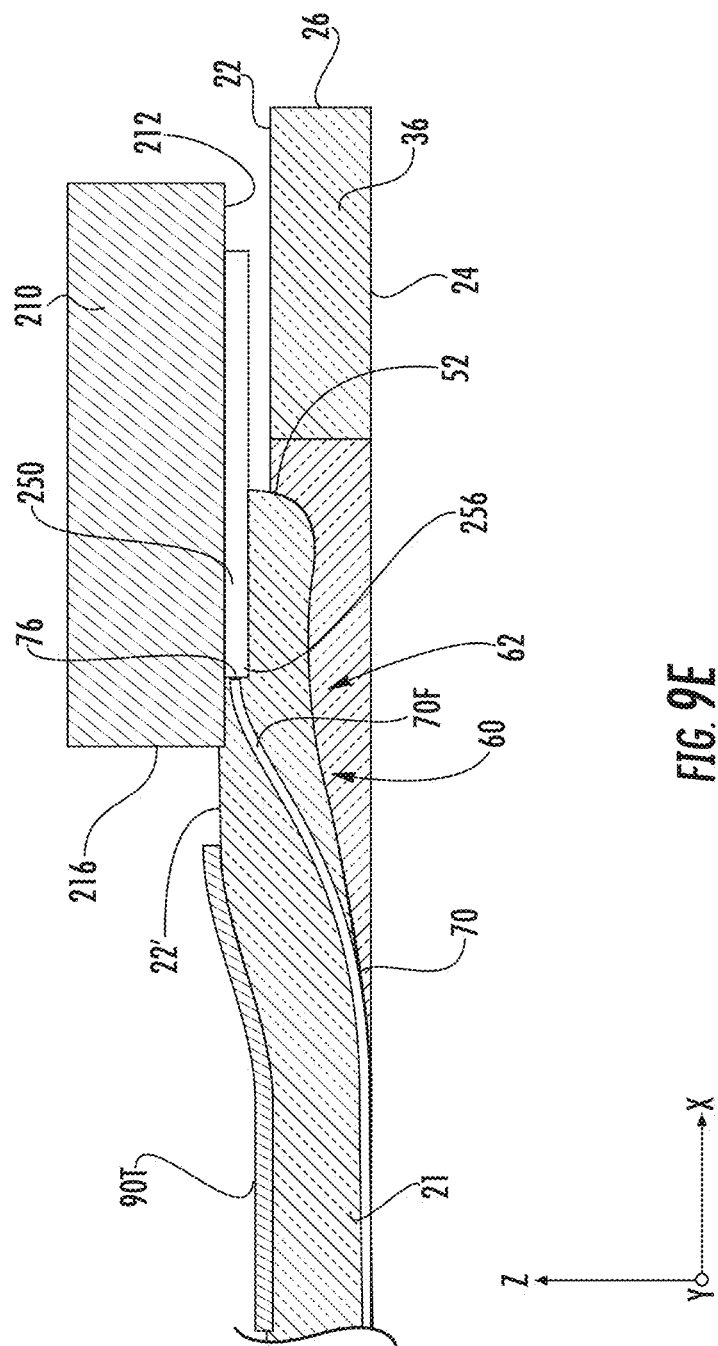

FIGS. 9D and 9E are similar to FIG. 9C and illustrate embodiments wherein an OE-IC 210 is disposed adjacent the vertical step 64 so that waveguide 70 can be butt coupled at back end 78 to the front end 252 of device waveguide 250. In FIG. 9D, the butt coupling occurs at the front-end 216 of the OE-IC 210 while in FIG. 9E the butt coupling occurs inboard of the front-end 216 at the bottom surface 214 where the device waveguide 250 is terminated to form front end 252.

Electrical connections between the cantilever element 50 and OE-IC 210 may be provided by, for example, solder bump pads or exposed vias that remain at or near the tip after the polishing operation. Surface tension forces associated with solder bump attachment may also be used to minimize butt coupling axial, lateral and/or angular misalignment.

Active Alignment Methods

Optimum evanescent coupling between the interconnection waveguides 70 and device waveguides 250 requires optimum alignment of OE interconnector 10 and OE-IC 210. This alignment can be accomplished using a number of different techniques, all of which are facilitated by the flexibility of the front-end section 62 of the cantilevered element(s) 50. In an example, the position of the front-end section 62 of a given cantilever element 50 can be adjusted by a gripper that accesses the front-end section through the through hole 116.

In one example, the waveguide alignment is active. Active alignment can be accomplished by monitoring the evanescently coupled optical power as the position of the front-end section 62 of cantilever element 50 is moved relative to OE-IC 210 or the position of the OE-IC is moved relative to the front-end section. The OE-IC 210 can be positioned by heating the OE-IC until the solder bumps 262 that electrically connect the OE-IC to the OE-PCB 11 and that define the stand-off distance between the OE-IC and the OE-PCB are softened. After optimum alignment is established, the OE-IC 210 is cooled while being held firmly in place to limit shifts due to the re-solidification of solder bumps 262.

There are a number of ways in which the optical power can be monitored when performing active alignment. In one example, OE-IC 210 includes an on-chip optical detector (e.g., photonic device 240), which is optically coupled to device waveguide 250. The on-chip optical detector can be electrically connected to monitoring equipment. Light can be launched into interconnection waveguide 70 at back end 78 and then detected by the on-chip optical detector of OE-IC 210.

In another example, the OE-IC 210 includes an optical source (e.g., photonic device 240) or is optically connected to a remote optical power source that in turn is optically connected to device waveguide 250. The optical power (light) is then coupled from OE-IC 220 to interconnection waveguide 70 at the front-end section 62 of cantilever element 50. The coupled light then travels through the interconnection waveguide 70 and then detected by an optical detector 500 to perform power monitoring. In one example, the optical detector 500 can be operably disposed on OE interconnector 10 and optically coupled to waveguide 70 either at back end 78 (e.g., evanescently coupled) or at another location.

Figure 10A:
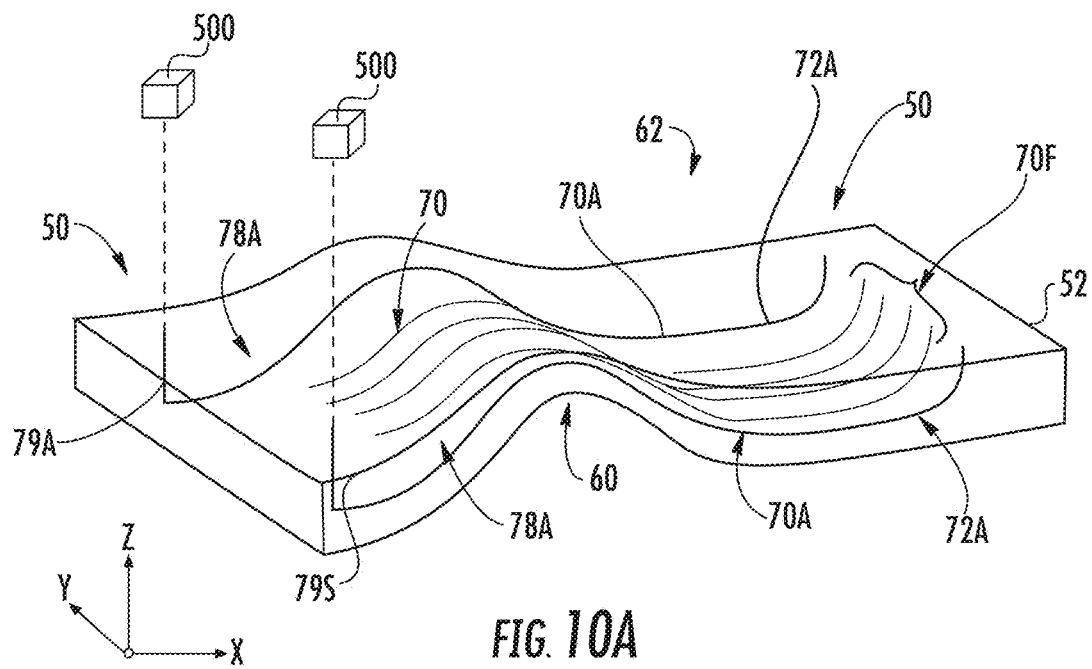
FIG. 10A is an elevated view of a cantilever element that at least one alignment optical waveguide that resides adjacent the main optical waveguide.
Figure 10B:
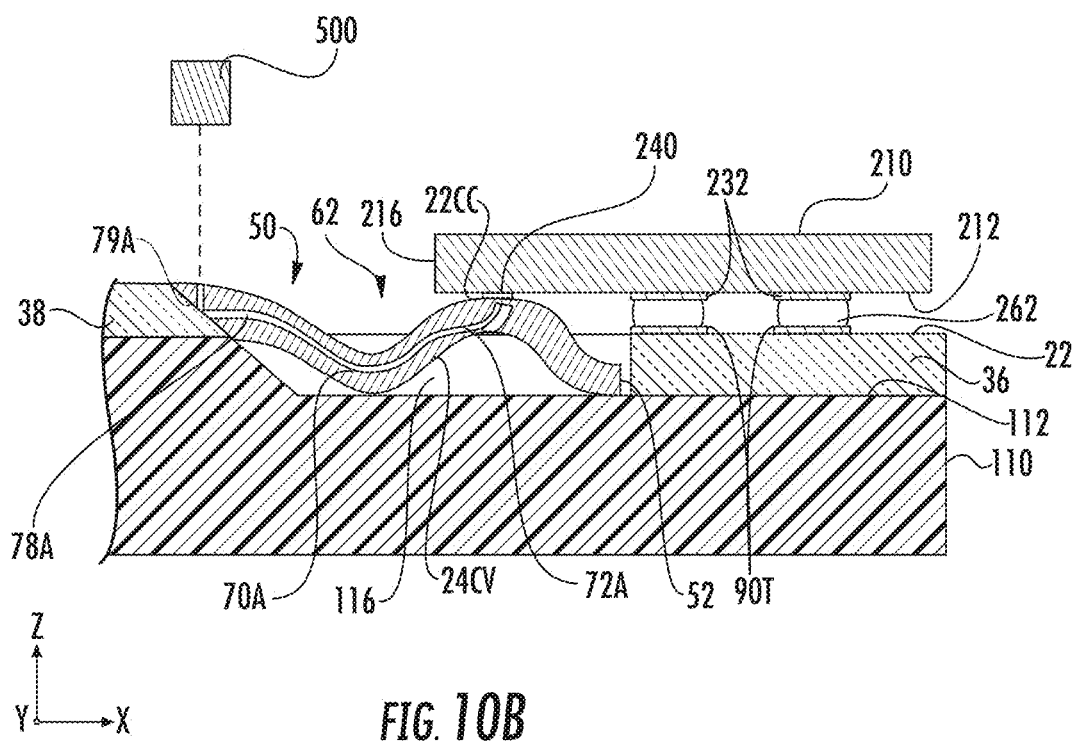
FIG. 10B is a cross-sectional view of a portion of a photonic assembly that shows the cantilever element of FIG. 10A operably arranged relative to an OE-PCB and an OE-IC 210, and showing an optical detector arranged relative to the turning element of the alignment optical waveguide to perform power monitoring in connection with an active alignment process.

FIG. 10A is an elevated view of cantilever element 50 illustrating an example where cantilever element 50 includes at least one alignment waveguide 70A that resides adjacent waveguide 70. FIG. 10B is a cross-sectional view of a portion of a photonic assembly 100 that shows the cantilever element 50 of FIG. 10A operably arranged relative to the OE-PCB 110 and the OE-IC 210. The waveguide 70A includes a front-end section 72A and a back-end section 78A, which includes a turning structure 79A. The turning structure 79A is configured to direct light out of the x-y plane and to optical detector 500. The alignment waveguide 70A is used only for aligning cantilever element 50 and waveguide 70 to OE-IC 210 while waveguide 70 is used for carrying data once the photonic assembly is aligned and operational.

In an example, optical detector 500 can comprise a photodetector, an imaging system such as a camera (e.g., digital camera), an integrating sphere, or like detector elements and components known in the art.

The flexibility of the cantilever element 50 allows it to be moved by small distances (e.g., up to 50 µm) within the x-y plane as well as out of the x-y plane. This movement distance is sufficient to enable initial alignment of the cantilever element 50 to OE-IC 210 using a commercial pick-and-place machine.

During solder bump reflow, the OE-IC 210 can shift laterally by small distances. However, the cantilever element 50 can be moved during the alignment process to compensate for such a shift.

In an example, the cantilever element front-end section 62 can be gripped by an actuator that moves it during the power peaking operation. Alternatively, etched holes (not shown) in the cantilever element 50 can be engaged by two actuation pins that can both laterally displace and rotate the cantilever element tip.

After alignment, the front-end section 62 of the cantilever element 50 can be bonded to the OE-IC 210. This can be accomplished using one or more of the following methods: 1) a UV curable adhesive (e.g., MasterBond UV25) that is index matched to waveguide materials; 2) a reflowed solder bump; 3) an electrically-conductive adhesive 4) an epoxy or thermal cure adhesive; and 4) laser heating to cause the cantilever element top surface to be fused to an oxide layer on the bottom surface 212 of the OE-IC 210.

Active alignment can also be accomplished using a vision system. The vision system can be used to observe the location of the front-end section 62 of the cantilever element 50 relative to the position of the device waveguides 250 of OE-IC 210. The vision system can image through the through hole 116 or another hole in OE-PCB 110. If the location of device waveguide 250 is difficult to observe directly, then fiducial marks patterned on the front-end section 62 of cantilever element 50 can be employed. Since the cantilever element 50 is transparent, the front-end section 62 can be moved to a location where its fiducial marks are aligned to the corresponding fiducial marks on OE-IC 210 and the vision system views through the cantilever element.

Active alignment can be performed by moving one or both of the cantilever element 50 and the OE-IC 210. Moving the OE-IC 210 may prove difficult when a firm electrical connection to the OE-IC 210 does not exist to power the optical sources and detectors. One approach includes locally reheating OE-IC 210 so that the conductive elements 262 soften slightly and allow the OE-IC to be laterally displaced by small distances (e.g., <25 um).

After the device waveguide 250 of OE-IC 210 is aligned to inter connection waveguide 70 of cantilever element 50, the can be cooled to lock it into its aligned position. During the cooling process, the OE-IC 210 can be firmly gripped to prevent small lateral shifts.

Passive Alignment Methods

Passive alignment methods can also be employed to align interconnection waveguide 70 of cantilever element 50 to the device waveguide 250 of OE-IC 210. Several passive alignment methods are now discussed.

Figure 11A:
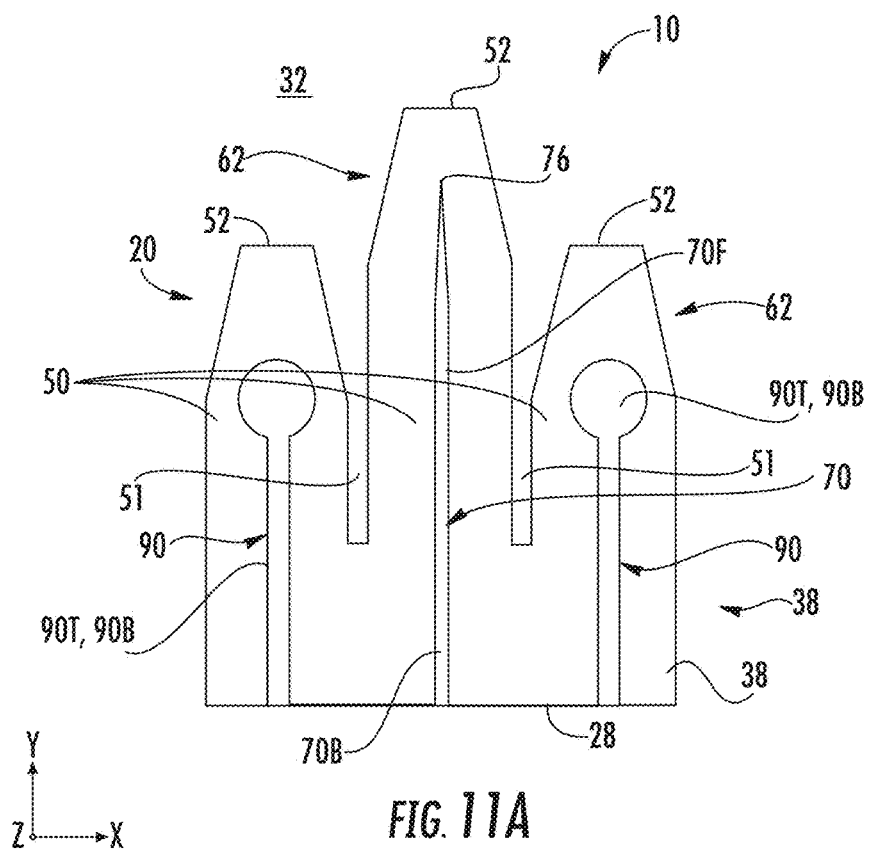
FIG. 11A is a top down view of the three cantilever elements of an example OE interconnector, wherein the optical waveguide of the cantilever element has a tapered end.

In one example, precision stops aligned to device waveguides 250 are employed. FIG. 11A is a top down view of a portion of OE interconnector 10 showing three cantilever elements 50 of an example OE interconnector 10. The cantilever element 50 supports waveguide 70 while the two side cantilever elements 50 are shorter and support electrical conductors 90, e.g., top-side conductors 90T or bottom-side conductors 90B. The front-end sections 62 of the cantilever elements 50 are tapered in the x-y plane as described above. This configuration allows for the electrical connections in the photonic assembly 100 to be located in close proximity to waveguide 70 while also allowing for separate positional adjustment for the electrical and optical interconnections.

In some cases, the formation of cantilever elements 50 is not precise, which can lead to waveguide 70 being off-center relative to sidewalls 54. Thus, in an example at least the front-end waveguide section 70F is formed after the cantilever element 50, including tapered front-end section 62, is formed. In an example, the front-end waveguide section 70F is formed using the aforementioned laser writing process.

Figure 11B:
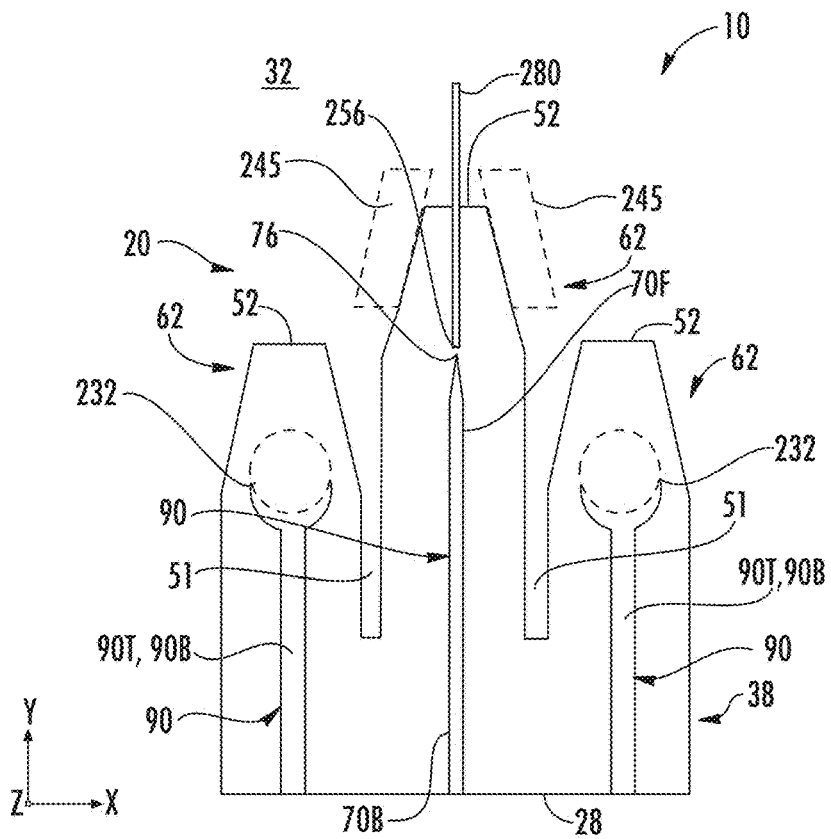
FIG. 11B is similar to FIG. 11 A and shows an example of how the tapered tip of the cantilever element can operably engage an alignment feature of an OE-IC to provide alignment between the OE interconnector optical waveguide and the OE-IC optical waveguide.

FIG. 11B is similar to FIG. 11A and shows the tapered front-end section 62 of the center cantilever element 50 passively aligned to a complementary alignment feature 245 of OE-IC 210. The alignment structure 245 can be fabricated with highly accurate placement on OE-IC 210 using photolithographic processes for example. For example, the alignment structure 245 can be formed as raised etch stops fabricated in photonic chip material, or as raised features created in deposited material, such as photoresist or polymer gripper structures, or as etched V-groove features.

Figure 11C:
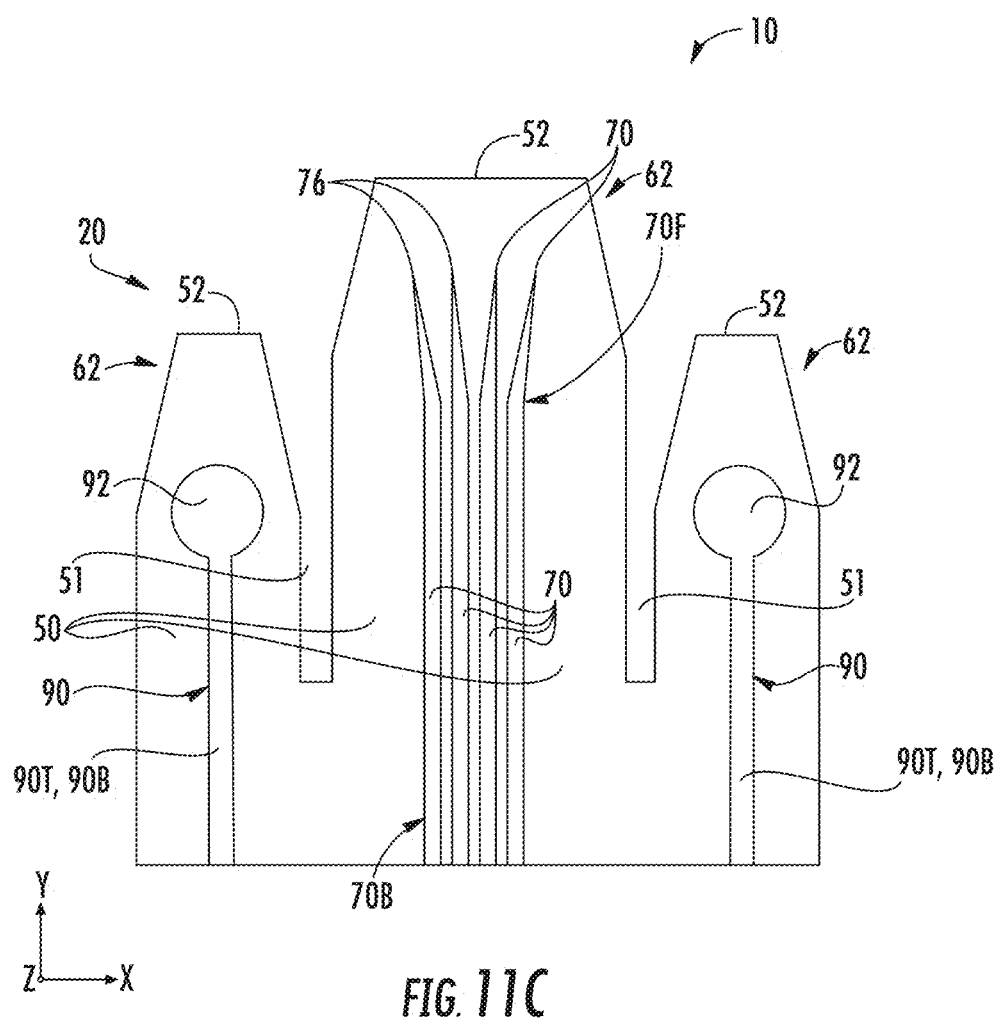
FIG. 11C is similar to FIG. 11A and shows an example where the cantilever element supports an array of optical waveguides that has a different pitch at the tip of the cantilever element than at the back end thereof.

FIG. 11C is similar to FIG. 11A and illustrates an example where the center cantilever element 50 supports multiple waveguides 70 that define a waveguide array. The waveguides 70 can be laser written so that waveguides are on precise pitch $p_1$, while the entire array is centered on the cantilever element with spacing d from each sidewall 54 as measured at a specific distance away from front end 52. The waveguide pitch $p_1$ of front-end sections 70F can be different from a pitch $p_2$ of back-end sections 70B to accommodate the waveguide density requirements of each region.

In an example, passive alignment of waveguide 70 of cantilever element 50 to the device waveguides of OE-IC 210 can be performed by creating an alignment feature on cantilever element 50 that aligns a complementary alignment feature 245 of OE-IC 210. For example, the alignment feature can comprise one or more holes and the alignment feature 245 can comprise one or more raised features. In another example, the alignment feature on cantilever member 50 can comprise the tapered front-end section 62 and the OE-IC alignment feature 245 can comprise the complementary angled alignment structure as shown in FIG. 11B.

Figure 12:
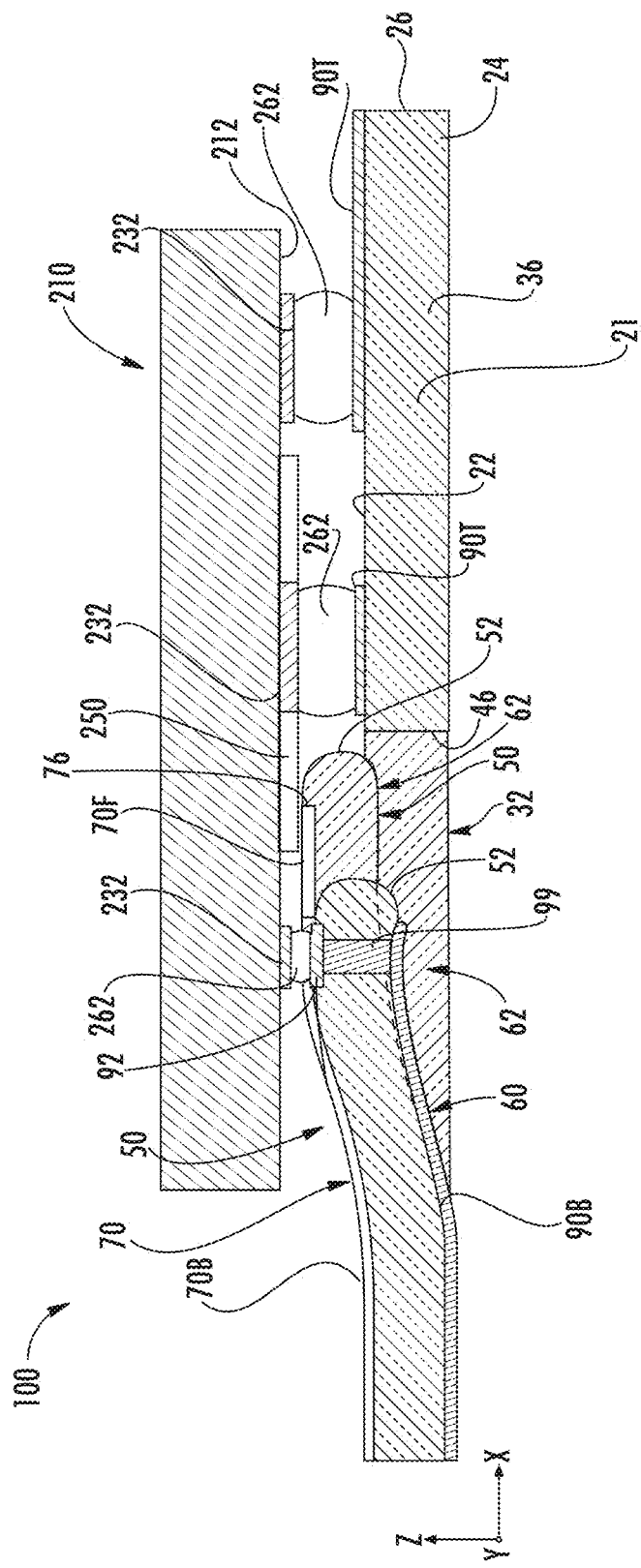
FIG. 12 is a close-up view of a portion of a photonic assembly that shows solder pads on the top surface of the OE-IC and aligned to the OE-IC optical waveguides.

In another example, passive alignment of waveguide 70 of cantilever element 50 to the device waveguides of OE-IC 210 can be performed using solder bump alignment. In this method, the lateral forces that arise during solder bump reflow (due to surface energy minimization) draw the two components into alignment. FIG. 12 is a close-up view of a portion of photonic assembly 100 that shows solder pads 232 on the top surface 212 of OE-IC 210 aligned to device waveguides 250. Mating solder pads 92 on the front-end section 62 of a cantilever element 50 are similarly precisely aligned to the front-end section of waveguide 70.

When the solder pads 92 and 232 on the two components become aligned due to solder bump forces, the waveguide 70 and the device waveguide 250 become aligned. Solder bump alignment forces can be enhanced by using smaller solder bumps 262 (e.g., <30 um diameter) and smaller solder bump pads 92 and 232 than are commonly used for electrical interconnections between electronic chips and PCBs. This is possible because the cantilever element 50 and the OE-IC 210 are fabricated from materials with similar CTEs, so that the joining solder bumps 262 are not required to have a large height to accommodate shear stresses during thermal excursions. The widths of waveguides 70 and device waveguide 250 in interconnection (coupling) regions can be adiabatically increased to provide coupling interconnections that are more tolerant to lateral misalignments induced during solder bump reflow.

Figure 13A:
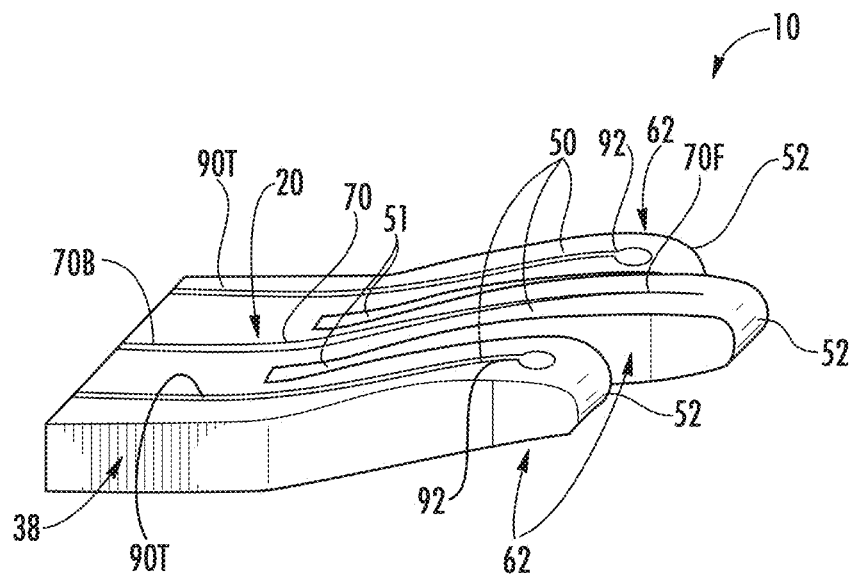
FIG. 13A is a close-up elevated view and FIG. 13B is a side view of the front-end portion of the OE interconnector 10 of FIG. 11A, wherein the OE interconnector has three cantilever elements, with the side elements configured to enable passive solder bump alignment of the optical waveguide supported by the cantilever element.
Figure 13B:
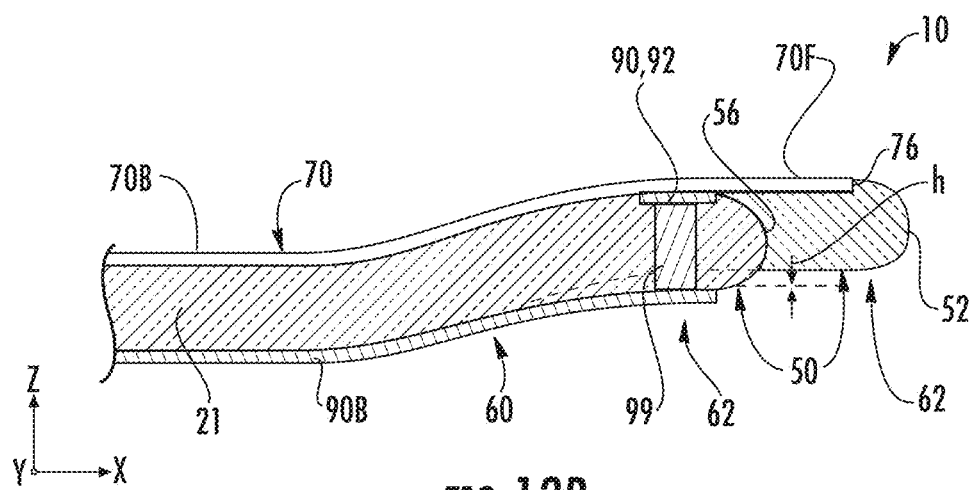

FIG. 13A is a close-up elevated view and FIG. 13B is a side view of the front-end portion of OE interconnector 10 of FIG. 11A, wherein the OE interconnector has three cantilever elements, with the side elements enabling passive solder bump alignment. In an example, the cantilever element 50 is substantially longer than the side cantilever elements to that it can flex to a greater extent than the side cantilever elements. The smaller side cantilever elements 50 are more than the cantilever elements so that the displacement of a solder bump pad causes the center cantilever element to move.

In the example shown in FIG. 13B, the cantilever front-end section 62 is higher than the two side cantilever tips by a distance h. This difference in tip high is used to accommodate the additional vertical distance occupied by the solder bump during alignment. This feature is also shown in FIG. 12.

Mechanical Support Function

The cantilever element 50 can serve as a mechanical support for OE-IC 210, especially during assembly operations that can give rise to in-plane or out-of-plane displacement of the OE-IC relative to its support substrate. For example, cantilever element 50 can be attached to OE-IC 210 using an epoxy or UV curable adhesive that can survive solder reflow. The attached cantilever element 50 can then help stabilize the OE-IC 210 and maintain its position during solder bump reflow. The cantilever element can also serve as a temporary mechanical support until a more permanent attachment solution (e.g., solder bump reflow, conductive adhesive curing, or underfill adhesive thermal cure) is complete.

Heat Transfer Function

The cantilever element 50 can also be used to enhance heat transfer away from components of the OE-IC 210. Since glass is a poor thermal conductor, heat transfer may be provided by thermally conductive materials that are applied to the outside surfaces of the cantilever element. For example, the top surface 22 and/or the bottom surface 24 of the cantilever element 50 can be metallized using the same metallization process that creates electrical conductors 90. Alternatively, a different metallization process can be used to selectively deposit thicker metallization layers in regions where improved heat transfer is required. Thermal conduction to the cantilever element 50 from the OE-IC 210 can be improved by providing multiple solder bump connections between the OE-IC 210 and the cantilever element 50 in close proximity to heat producing components on OE-IC 210.

The cantilever element 50 can also serve as a fin to dissipate heat to surrounding air or support substrate materials. The slots 53 formed in cantilever element 50 as shown in FIG. 6B can be used to increase the surface area of the fin for heat dissipation through convection. If the cantilever element 50 is encapsulated in a thermally conductive material, the slots 53 can also enhance thermal conduction from the cantilever element to surrounding materials.

Laser drilled holes can also be used to improve heat transfer vertically through the cantilever element 50. The holes can be metallized and/or filled with thermally conductive materials, and they can be located on the cantilever element 50 so that after fabricating the photonic assembly they are in close proximity to components on the OE-IC 210. Solder bump pads 92 can be formed over or near metallized holes so that heat is transferred from the heat-generating component through the solder bumps 262, down through the metallized holes, and away from the OE-IC 210 via the metallized cantilever element 50.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. An optical-electrical (OE) interconnection device, comprising:
   a glass support member comprising a body, a top surface, a bottom surface, a front-end portion and a back-end portion, wherein the body comprises an aperture that separates the front-end and back-end portions and wherein the front-end and back-end portions reside in a first plane;
   wherein the glass support member further comprises at least one cantilever element that extends into the aperture from the back-end portion toward the front-end portion, the at least one cantilever element having a bend region and a front-end section with a front end, wherein the bend region of the at least one cantilever element is permanently maintained by glass material of the at least one cantilever element, and wherein the bend region causes the front-end section to extend in a first direction perpendicular to the first plane and that is flexible in at least the first direction;
   at least one interconnection optical waveguide supported within the body of the glass support member and running from the back-end portion to the front-end section of the at least one cantilever element; and
   at least one electrical conductor supported by the glass support member.

2. The OE interconnection device according to claim 1, wherein the at least one electrical conductor comprises a first electrical conductor supported by the back-end portion of the glass support member and a second electrical conductor supported by the front-end portion of the glass support member.

3. The OE interconnection device according to claim 1, wherein the front-end section of the at least one cantilever element comprises a width that narrows towards the front end.

4. The OE interconnection device according to claim 1, wherein the at least one electrical conductor comprises a top-side electrical conductor on the top surface of the glass support member, a bottom-side electrical conductor on the bottom surface of the glass support member, and a conductive via that electrically connects the top-side and the bottom-side electrical conductors through the body of the glass support member.

5. The OE interconnection device according to claim 1, wherein the at least one cantilever element comprises first and second cantilever elements, and wherein the at least one interconnection optical waveguide is supported by the first cantilever element and the at least one electrical conductor is supported by the second cantilever element.

6. The OE interconnection device according to claim 1, wherein the at least one cantilever element comprises a first cantilever element that supports the at least one interconnection optical waveguide and a second cantilever element that supports an alignment waveguide.

7. The OE interconnection device according to claim 1, wherein the at least one interconnection optical waveguide comprises a plurality of interconnection optical waveguides each having a back end at the back-end portion and a front end at the front-end portion, with the front and back ends of the plurality of interconnection optical waveguides respectively defining a first pitch and a second pitch, wherein the first pitch is different from the second pitch.

8. The OE interconnection device according to claim 1, wherein the front-end section of the at least one cantilever element is flexible in a second direction perpendicular to the first direction.

9. The OE interconnection device according to claim 1, wherein the at least one interconnection optical waveguide comprises a back-end waveguide section and a front-end waveguide section, wherein the back-end waveguide section is buried within the body of the back-end portion of the glass support member and wherein the front-end waveguide section resides at or adjacent the top surface of the front-end section of the at least one cantilever element.

10. The OE interconnection device according to claim 9, wherein the at least one interconnection optical waveguide comprises a front end and a curved portion in the front-end waveguide section so that the front end of the front-end waveguide section terminates at the top surface of the glass support member at the front-end section of the at least one cantilever element.

11. The OE interconnection device according to claim 1, wherein the at least one interconnection optical waveguide comprises an output end that is optically coupled to a turning structure.

12. The OE interconnection device according to claim 11, wherein the turning structure comprises a total-internal-reflection surface that resides either within the body of the at least one cantilever element or at the front end of the at least one cantilever element.

13. The OE interconnection device according to claim 11, wherein the turning structure is optically coupled to at least one lens element on the top surface of the glass support member at the front-end section of the at least one cantilever element.

14. The OE interconnection device according to claim 1, wherein the front-end section of the at least one cantilever element resides in a second plane that is parallel to the first plane and displaced therefrom by a height hC that is in the range of 50 microns to 500 microns.

15. The OE interconnection device according to claim 1, wherein the at least one cantilever element comprises a plurality of cantilever elements that are independently flexible and that extend in the same direction.

16. The OE interconnection device according to claim 15, wherein each cantilever element of the plurality of cantilever elements has a length, and wherein at least some cantilever elements of the plurality of cantilever elements are of different lengths.

17. The OE interconnection device according to claim 15, wherein each cantilever element of the plurality of cantilever elements has a height relative to the first plane and wherein not all of the heights are the same.

18. The OE interconnection device according to claim 1, wherein the at least one cantilever element has opposite sidewalls, and wherein the opposite sidewalls are angled in the first direction.

19. The OE interconnection device according to claim 1, wherein the bend region defines a convex portion of the top surface of the at least one cantilever element, and wherein the at least one interconnection optical waveguide terminates within the convex portion.

20. A photonic assembly comprising:
the OE interconnection device according to claim 1; and
a first OE device that supports the OE interconnection device and that comprises at least one of an electrical connection and an optical connection to the OE interconnection device.

21. The photonic assembly according to claim 20, further comprising a second OE device, wherein the OE interconnection device provides an electrical interconnection and an optical interconnection between the first OE device and the second OE device.

22. A photonic assembly, comprising:
the OE interconnection device according to claim 1, wherein the at least one electrical conductor defines first conductive elements;
an OE printed circuit board (OE-PCB) that comprises a top surface and a through hole, wherein the OE-PCB comprises second conductive elements and supports the OE interconnection device so that the front-end section of the at least one cantilever element extends into the through hole so that the front-end section of the at least one cantilever element resides adjacent and above the top surface of the OE-PCB;
an optical-electrical integrated circuit (OE-IC) having third conductive elements and that is supported adjacent and above the top surface of the OE-PCB in a flip-chip configuration using solder bumps, the OE-IC having at least one device waveguide; and
wherein a front-end waveguide section of the at least one interconnection optical waveguide is operably disposed relative to the at least one device waveguide to establish optical coupling therebetween; and
wherein the first, second and third conductive elements and the solder bumps are electrically connected to define a first electrical path between the OE-PCB and the OE-IC.

23. The photonic assembly according to claim 22, wherein the at least one interconnection optical waveguide is optically coupled to the at least one device waveguide via evanescent coupling.

24. The photonic assembly according to claim 22, wherein the OE-IC comprises at least one alignment feature that acts to optically align the at least one interconnection optical waveguide with the at least one device waveguide.

25. The photonic assembly according to claim 24, wherein the OE interconnection device comprises on the at least one cantilever element at least one alignment feature that is complementary to the at least one alignment feature of the OE-IC.

26. The photonic assembly according to claim 22, wherein the OE-IC comprises an active component, and the at least one cantilever element comprises a first cantilever element that supports the at least one interconnection optical waveguide and a second cantilever element that supports an alignment waveguide, wherein the alignment waveguide is optically coupled to the active component.

27. The photonic assembly according to claim 22, wherein the front-end section of the at least one cantilever element is in mechanical contact with the top surface of the OE-PCB to provide mechanical support for the OE-IC.

28. The photonic assembly according to claim 22, wherein the first conductive elements comprise a top-side electrical conductor on the top surface of the glass support member, a bottom-side electrical conductor on the bottom surface of the glass support member, and a conductive via that electrically connects the top-side and bottom-side electrical conductors through the body of the glass support member, and wherein the top-side electrical conductor is in electrical contact with one of the third conductive elements of the OE-IC to define a second electrical path between the OE-PCB and the OE-IC.

29. The photonic assembly according to claim 22, wherein the at least one interconnection optical waveguide comprises a back-end waveguide section and a front-end waveguide section, wherein the back-end waveguide section is buried within the body of the back-end portion of the glass support member and wherein the front-end waveguide section resides at or adjacent a top surface of the front-end section of the at least one cantilever element.

30. A method of optically interconnecting first and second optical-electrical (OE) devices, comprising:
supporting an OE interconnection device according to claim 1 with the first OE device;
aligning the OE interconnection device with the second OE device by flexing the front-end section of the at least one cantilever element so that a front-end waveguide section of the at least one interconnection optical waveguide aligns with and is optically coupled to at least one device waveguide of the second OE device in an aligned position; and
securing the front-end section of the at least one cantilever element to the second OE device in the aligned position.

31. The method according to claim 30, wherein the second OE device comprises a at least one OE electrical conductor, and the method further comprises establishing electrical contact between the at least one electrical conductor of the OE interconnection device and the at least one OE electrical conductor of the second OE device.

32. The method according to claim 31, wherein the OE interconnection device comprises a front-end portion that comprises a top surface, and wherein the at least one electrical conductor resides on the top surface of the front-end portion of the OE interconnection device.

33. The method according to claim 30, wherein the top surface of the body comprises a top-side electrical conductor of the at least one electrical conductor, the bottom surface of the body comprises a bottom-side electrical conductor of the at least one electrical conductor, and wherein a conductive via electrically connects the top-side and bottom-side electrical conductors through the body.

34. The method according to claim 30, further comprising disposing the second OE device relative to the first OE device in a flip-chip configuration and establishing electrical contact between the first and second OE devices using solder bumps.

35. The method according to claim 30, wherein the aligning of the OE interconnection device with the second OE device comprises monitoring an amount of optical power transmitted between the at least one interconnection optical waveguide and the at least one device waveguide and establishing the aligned position at a maximum of the transmitted optical power.

36. The method according to claim 30, wherein the second OE device comprises a photonic device, the at least one cantilever element comprises a first cantilever element that supports the at least one interconnection optical waveguide and a second cantilever element that supports an alignment waveguide, and wherein the aligning of the OE interconnection device with the second OE device comprises optically coupling the alignment waveguide to the photonic device and monitoring an amount of optical power transmitted between the photonic device and the alignment waveguide.

37. The method according to claim 30, wherein the aligning of the OE interconnection device with the second OE device comprises engaging a first alignment feature on the front-end section of the at least one cantilever element with a second alignment feature on the second OE device.

38. The method according to claim 30, further comprising forming at least a portion of the at least one interconnection optical waveguide using laser writing.

39. The method according to claim 30, further comprising forming at least a portion of the at least one interconnection optical waveguide using an ion-exchange process.

40. The method according to claim 30, further comprising forming the at least one interconnection optical waveguide without removing glass of the OE interconnection device.

41. The method according to claim 30, further comprising forming the at least one interconnection optical waveguide without adding glass to the body.

42. The method according to claim 30, wherein the at least one cantilever element has a top surface, wherein the front-end waveguide section resides at a depth below the top surface, the method further comprising removing a portion of the top surface to reduce said depth.

43. The method according to claim 30, wherein the first and second OE devices are separated by a stand-off distance defined by solder bumps, and wherein the aligning of the OE interconnection device with the second OE device comprises heating the solder bumps to reduce the stand-off distance.

44. The method according to claim 30, wherein the first OE device comprises an OE printed circuit board (OE-PCB) and the second OE device comprises an OE integrated circuit (OE-IC).

45. The method according to claim 44, wherein the OE-PCB comprises top and bottom sections and a through hole, and wherein the supporting of the OE interconnection device comprises sandwiching the back-end portion of the glass support member between the top and bottom sections of the OE-PCB such that the front-end section of the at least one cantilever element extends into the through hole.

46. The OE interconnection device according to claim 1, wherein the bend region of the at least one cantilever element comprises a first curve extending in an upward or downward direction, and comprises a second curve extending in a forward direction, thereby forming a S-like shape.

* * * * *

UNITED STATES PATENT AND TRADEMARK OFFICE
CERTIFICATE OF CORRECTION

PATENT NO. : 10,564,354 B2
APPLICATION NO. : 15/846312
DATED : February 18, 2020
INVENTOR(S) : Fortusini et al.

Page 1 of 1

It is certified that error appears in the above-identified patent and that said Letters Patent is hereby corrected as shown below:

In the Claims

In Column 22, Line 42, Claim 22, delete "second" and insert -- second, --, therefor.

In Column 23, Line 37, Claim 31, after "comprises" delete "a".

Signed and Sealed this
Twelfth Day of May, 2020

Andrei Iancu
*Director of the United States Patent and Trademark Office*